(12) United States Patent
Englekirk et al.

(10) Patent No.: US 12,298,798 B2
(45) Date of Patent: May 13, 2025

(54) CONTROLLABLE TEMPERATURE COEFFICIENT BIAS CIRCUIT

(71) Applicant: pSemi Corporation, San Diego, CA (US)

(72) Inventors: Robert Mark Englekirk, Littleton, CO (US); Keith Bargroff, San Diego, CA (US); Christopher C. Murphy, Lake Zurich, IL (US); Tero Tapio Ranta, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 18/736,150

(22) Filed: Jun. 6, 2024

(65) Prior Publication Data

US 2024/0402749 A1    Dec. 5, 2024

Related U.S. Application Data

(63) Continuation of application No. 18/359,513, filed on Jul. 26, 2023, now Pat. No. 12,007,803, which is a
(Continued)

(51) Int. Cl.
*G05F 3/26*      (2006.01)
*G05F 3/24*      (2006.01)
(Continued)

(52) U.S. Cl.
CPC .............. *G05F 3/262* (2013.01); *G05F 3/242* (2013.01); *H03M 1/66* (2013.01); *H03M 1/742* (2013.01)

(58) Field of Classification Search
CPC .......... G05F 3/242; G05F 3/245; G05F 3/262; H03M 1/66; H03M 1/742
See application file for complete search history.

(56) References Cited

U.S. PATENT DOCUMENTS 10,290,330 B1    5/2019    Kamath et al.
10,775,827 B2    9/2020    Englekirk et al.
(Continued)

OTHER PUBLICATIONS

Jackson, Lakaisha, Office Action received from the USPTO dated Mar. 25, 2019 for U.S. Appl. No. 15/793,943, 6 pgs.
(Continued)

*Primary Examiner* — Jue Zhang
*Assistant Examiner* — Lakaisha Jackson
(74) *Attorney, Agent, or Firm* — Steinfl + Bruno LLP

(57) ABSTRACT

A controllable temperature coefficient bias (CTCB) circuit is disclosed. The CTCB circuit can provide a bias to an amplifier. The CTCB circuit includes a variable with temperature (VWT) circuit having a reference circuit and a control circuit. The control circuit has a control output, a first current control element and a second current control element. Each current control element has a "controllable" resistance. One of the two current control elements may have a relatively high temperature coefficient and another a relatively low temperature coefficient. A controllable resistance of one of the current control elements increases when the controllable resistance of the other current control element decreases. However, the "total resistance" of the current control circuit remains constant with a constant temperature. The VWT circuit has an output with a temperature coefficient that is determined by the relative amount of current that flows through each current control element of the control circuit. A Current Digital to Analog Converter (IDAC) scales the output of the VWT and provides the scaled output to an amplifier bias input.

20 Claims, 17 Drawing Sheets

Related U.S. Application Data continuation of application No. 17/987,722, filed on Nov. 15, 2022, now Pat. No. 11,720,136, which is a continuation of application No. 16/989,435, filed on Aug. 10, 2020, now Pat. No. 11,507,125, which is a continuation of application No. 15/793,943, filed on Oct. 25, 2017, now Pat. No. 10,775,827.

(51) Int. Cl.
  *H03M 1/66* (2006.01)
  *H03M 1/74* (2006.01)

(56) References Cited

U.S. PATENT DOCUMENTS

| | | | |
|---|---|---|---|
| 11,507,125 | B2 | 11/2022 | Englekirk et al. |
| 11,720,136 | B2 | 8/2023 | Englekirk et al. |
| 12,007,803 | B2 | 6/2024 | Englekirk et al. |
| 2007/0296487 | A1 | 12/2007 | Kuriyama |
| 2014/0340150 | A1 | 11/2014 | Dempsey et al. |
| 2016/0252920 | A1 | 9/2016 | Chu |
| 2018/0138895 | A1 | 5/2018 | Liu et al. |
| 2018/0181155 | A1 | 6/2018 | Iizuka et al. |
| 2018/0292852 | A1* | 10/2018 | Krishnan ............... G05F 1/575 |
| 2019/0121383 | A1 | 4/2019 | Englekirk et al. |
| 2019/0316973 | A1* | 10/2019 | Ippolito ................ G01K 7/01 |
| 2021/0026391 | A1 | 1/2021 | Englekirk et al. |
| 2021/0080992 | A1* | 3/2021 | Maalouf ............... G05F 1/468 |
| 2022/0120620 | A1* | 4/2022 | Lee ...................... G01K 7/01 |
| 2023/0152836 | A1 | 5/2023 | Englekirk et al. |
| 2024/0094757 | A1 | 3/2024 | Englekirk et al. |

OTHER PUBLICATIONS

Jackson, Lakaisha, Office Action received from the USPTO dated Dec. 12, 2019 for U.S. Appl. No. 15/793,943, 8 pgs.

Jackson, Lakaisha, Notice of Allowance received from the USPTO dated May 14, 2020 for U.S. Appl. No. 15/793,943, 7 pgs.

pSEMI Corporation, Preliminary Amendment filed in the USPTO dated Jan. 23, 2018 for U.S. Appl. No. 15/793,943, 7 pgs.

pSEMI Corporation, Response filed in the USPTO dated May 28, 2019 for U.S. Appl. No. 15/793,943, 7 pgs.

pSEMI Corporation, Response filed in the USPTO dated Mar. 11, 2020 for U.S. Appl. No. 15/793,943, 9 pgs.

Jackson, Lakaisha, Office Action received from the USPTO dated Oct. 15, 2021 for U.S. Appl. No. 16/989,435, 21 pgs.

Jackson, Lakaisha, Final Office Action received from the USPTO dated Apr. 27, 2022 for U.S. Appl. No. 16/989,435, 10 pgs..

Jackson, Lakaisha, Notice of Allowance received from the USPTO dated Jul. 25, 2022 for U.S. Appl. No. 16/989,435, 10 pgs.

Jackson, Lakaisha, Notice of Allowance received from the USPTO dated Mar. 22, 2023 for U.S. Appl. No. 17/987,722, 14 pgs.

Jackson, Lakaisha, Notice of Allowance received from the USPTO dated Feb. 14, 2024 for U.S. Appl. No. 18/359,513, 15 pgs.

\* cited by examiner

CONTROLLABLE TEMPERATURE COEFFICIENT BIAS CIRCUIT

CROSS-REFERENCE TO RELATED APPLICATIONS-CLAIM OF PRIORITY

The present application is a continuation of, and claims priority to, co-pending and commonly assigned U.S. patent application Ser. No. 18/359,513, filed Jul. 26, 2023, entitled "Controllable Temperature Coefficient Bias Circuit", to issue on Jun. 11, 2024 as U.S. Pat. No. 12,007,803, and the contents of said application is incorporated herein by reference in its entirety, application Ser. No. 18/359,513 is a continuation of, and claims priority to, commonly assigned U.S. patent application Ser. No. 17/987,722, filed Nov. 15, 2022, entitled "Controllable Temperature Coefficient Bias Circuit", issued on Aug. 8, 2023 as U.S. Pat. No. 11,720,136, and the contents of said application is incorporated herein by reference in its entirety, application Ser. No. 17/987,722 is a continuation of, and claims priority to, commonly assigned U.S. patent application Ser. No. 16/989,435, filed Aug. 10, 2020, entitled "Controllable Temperature Coefficient Bias Circuit", issued on Nov. 22, 2022 as U.S. Pat. No. 11,507,125, and the contents of said application is incorporated herein by reference in its entirety, application Ser. No. 16/989,435 is a continuation of, and claims priority to, and commonly assigned U.S. patent application Ser. No. 15/793,943, filed Oct. 25, 2017, entitled "Controllable Temperature Coefficient Bias Circuit", now U.S. Pat. No. 10,775,827, issued Sep. 15, 2020, and the contents of said application is incorporated herein by reference in its entirety.

TECHNICAL FIELD

Background

This disclosure generally relates to amplifiers and more specifically to amplifiers and to means for biasing amplifiers that operate over a relatively broad operational temperature range.

Background

It is common for electrical amplifiers to operate over a relatively broad range of temperatures. In some cases, this is because such amplifiers are used in devices that are required to operate outdoors or in an otherwise uncontrolled environments. In some cases, it may be that an amplifier operates in close proximity to other components that generate heat during operation. In other cases, it may be the amplifier itself heats up and so contributes to the range of temperatures over which the amplifier operates. That is, the amplifier may dissipate more or less energy, and thus generate more or less heat at different times during its operation. Nonetheless, in many such cases, specifications imposed on such amplifiers make it desirable for them to operate with a relatively constant gain over a broad temperature range.

Achieving constant gain over temperature variations can be challenging, since the gain of an amplifier can vary over temperature when transistors (such as field effect transistors (FETs)) are the components within the amplifier that provide the gain. In response to variations in the transconductance ($g_m$) of one or more of the FETs of an amplifier, the gain of the amplifier may vary. In cases in which it is important to maintain a constant gain over temperature, it may be necessary to provide a means by which the effects of the variations in the $g_m$ can be offset in order to maintain a constant gain over temperature.

FIG. 1 is a simplified schematic of one circuit 100 used to assist in maintaining constant $g_m$. The circuit 100 is a sometimes referred to as a proportional-to-absolute-temperature (PTAT) circuit. In the case of the circuit 100, a current $I_1$ flows through the transistor 106 and a current $I_2$ flows through the FET 110. The currents $I_1$ and $I_2$ change over temperature in order to maintain a constant $g_m$ for the FET 108. The current $I_1$ is mirrored in FETs 102 and 104. The currents in FETs 102, 104 flow through an interface circuitry 115. The interface circuitry 115 in turn provides an output bias current to an amplifier 116. Accordingly, if an amplifying FET (not shown) within the amplifier 116 is matched to the FET 108, the change in current $I_1$ will hold the $g_m$ of the FET in the amplifier 116 constant. Thus, the amplifier will have an essentially constant gain over temperature. The following analysis provides a better understanding of this relationship between the currents and transconductance in the circuit 100.

The two upper FETs 106, 110 form a current mirror that ensures that current $I_2$ is equal to the current $I_1$.

$$I_1 = I_2 \qquad \text{EQ. 1}$$

In addition, the voltage $V_{gs1}$ (gate-to-source voltage for FET 108) is equal to the voltage $V_{gs2}$ (gate-to-source voltage for FET 114) plus the voltage dropped across the resistor 112 (i.e., the product of the current $I_2$ and the resistance R of a resistor 112 coupled between the source of the FET 114 and ground).

$$V_{gs1} = V_{gs2} + I_2 R \qquad \text{EQ. 2}$$

The overdrive voltage $V_{od1}$, $V_{od2}$ of each FET 108 114 is that portion of the voltage $V_{gs1}$, $V_{gs2}$ from gate to source, respectively, that is above the threshold voltage $V_t$ of each FET 108, 114. Accordingly:

$$V_{od} = V_{gs} - V_t \qquad \text{EQ. 3}$$

Accordingly, subtracting $V_t$ from both sides of EQ. 2 (assuming that each FET 108, 114 has the same value of $V_t$) results in:

$$V_{od1} = V_{od2} + I_2 R \qquad \text{EQ. 4}$$

If the FET 114 has a width that is m times that of the FET 108, then the two overdrive voltages, $V_{od1}$, $V_{od2}$ are related by:

$$V_{od2} = \frac{V_{od1}}{\sqrt{m}} \qquad \text{EQ. 5}$$

Substituting into EQ. 4:_

$$V_{od1} = \frac{V_{od1}}{\sqrt{m}} + I_2 R \qquad \text{EQ. 6}$$

For the FETs 108, 114, the transconductance can be defined as:

$$g_m = \frac{2I}{V_{od}} \qquad \text{EQ. 7}$$

Therefore:

$$V_{od1} = \frac{2I_1}{g_m} \qquad \text{EQ. 8}$$

substituting in EQ. 6:

$$\frac{2I_1}{g_{m1}} = \frac{2I_1}{\sqrt{m}\, g_{m1}} + I_1 R \qquad \text{EQ. 9}$$

Solving for $g_m$:

$$g_{m1} = 2\frac{\left(1 - \frac{1}{\sqrt{m}}\right)}{R} \qquad \text{EQ. 10}$$

If the width to Length ratio of FET 114 is four times that of FET 108, m=4, then:

$$g_{m1} = 2\frac{\left(1 - \frac{1}{2}\right)}{R} = 1/R \qquad \text{EQ. 11}$$

Therefore, it can be seen from EQ. 11 that the transconductance $g_{m1}$ of the FET 108 is constant and proportional to the inverse of R. By using a FET 108 having a temperature coefficient that is essentially the same as the temperature coefficient of the FET of the amplifier (a "like-kind" device), the currents $I_1$, $I_2$ that flow in the circuit 100 vary to maintain the constant $g_m$ of the FET 108. Since the currents that flow through the FETs 102, 104 change to maintain a constant $g_m$, these currents $I_1$, $I_2$ can be used to provide a bias current for an amplifier 116 (or to drive a current mirror that generates the bias current). Accordingly, the amplifier bias currents will increase with temperature to maintain a constant $g_m$ and thus a constant amplifier gain over varying temperature.

One problem with using the circuit 100 to assist in maintaining a constant gain is that the FET 108 is expected to be a "like-kind" device to that of amplifier gain device. That is, the temperature coefficient of the FET 108 should be matched to the amplifier gain device. However, in some cases, it may be difficult to use a "like-kind" device. For example, the circuit 100 shown relies upon a current mirror established between the FETs 106 and 110 and between FETs 108, 114. However, if the amplifier gain device is a FET with a zero volt threshold voltage, a "like-kind" device will not operate well in the current mirror. This is because current mirrors do not operate well with zero volt threshold devices. Alternatively, a non-like-kind device having a temperature coefficient that is similar to the gain FET can be selected. Empirical methods can be used to set the temperature coefficient of a "non-like-kind" device, such as a diode. However, such attempts to match the temperature coefficient of the gain FET of the amplifier can be difficult and result in an inaccurate match resulting in poor stabilization of the gain over temperature.

In addition to the problems noted above, some amplifiers are required to operate in an environment in which they are rapidly switched on and off. Therefore, the circuits need to settle to a final value quickly and precisely to ensure that the bias of the amplifier can quickly be attained with the requisite accuracy. In situations in which silicon-on-insulator (SOI) FETs are being used in the amplifier, additional challenges to the use of like-kind devices in the gain control circuit can arise. This is because SOI devices can have body effects that increase the time constant at turn on.

Accordingly, it would be desirable to provide a circuit that can be used to assist in maintaining a constant gain during operation over a relatively broad range of temperatures without suffering the drawbacks noted above.

SUMMARY

A controllable temperature coefficient bias (CTCB) circuit is disclosed. In some embodiments, the CTCB circuit provides a bias to an amplifier. In some such embodiments, the bias is a current, however in others, the bias is a voltage. Two separate controls are provided, a first that sets the amount of current provided at a predetermined reference temperature and a second that sets the slope of the temperature coefficient (i.e., the change in current over temperature). Each control can be exercised independently. Accordingly, the slope of the temperature coefficient remains constant with changes to the current level at the reference temperature and likewise, the slope of the temperature coefficient remains constant with changes to the current level at the reference temperature. In some embodiments, either one or both of the controls are operated by setting a digital value. In some such embodiments, the digital value changes the effected parameter by an amount to the change in the digital value. Accordingly, each increment in the digital value causes the controlled parameter (either current at the reference temperature or slope of the temperature coefficient) to change by the same amount.

A variable with temperature (VWT) circuit comprises a reference circuit and a control circuit. The control circuit comprises a control port, a first current control element and a second current control element. Each current control element has a "controllable" resistance that is controllable by a control processor. In some embodiments, the current control elements are controlled by a digital control signal. In some embodiments, one of the two current control elements has a relatively high temperature coefficient and one has a relatively low temperature coefficient. The temperature coefficient of the current control elements is the ratio of the change in resistance, $\Delta R$ to a change in temperature $\Delta T$.

In some embodiments, the controllable resistance of one of the current control elements increases and the controllable resistance of the other current control element decreases. In some such embodiments, the "total resistance" of the current control circuit remains constant with temperature. However, the ratio of the current that flows through each of the current control elements changes with respect to one another.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

Figure 2:
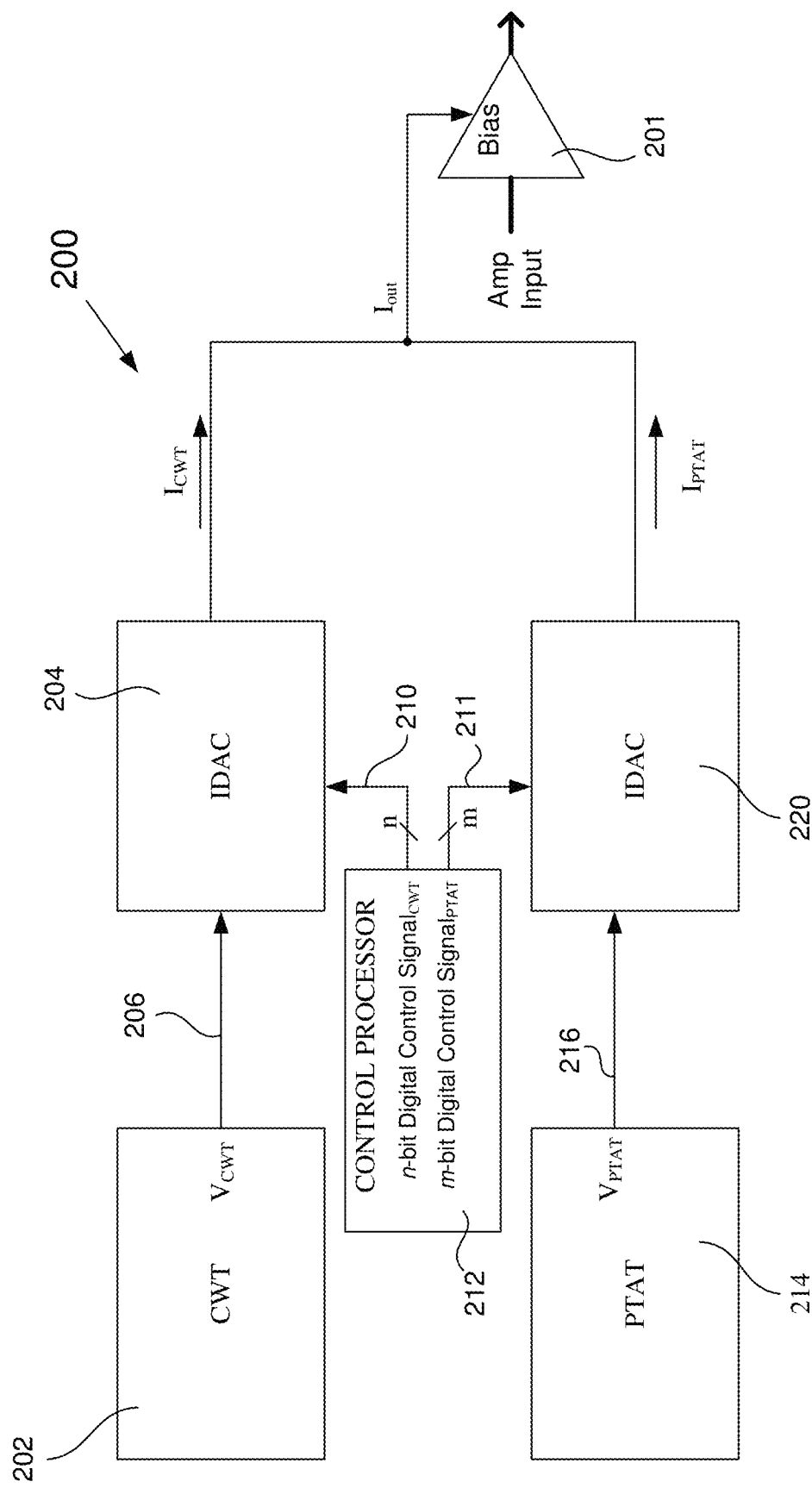
FIG. 2 is a simplified block diagram of one embodiment of the disclosed apparatus for providing a temperature compensated bias current.

FIG. 2 is a simplified block diagram of one embodiment of a controllable temperature coefficient bias circuit 200. The circuit 200 comprises a "constant with temperature" (CWT) circuit 202. The CWT circuit 202 provides an output voltage ($V_{CWT}$) to a first "current digital to analog converter" (IDAC) 204. In other embodiments, the CWT circuit 202 outputs a current to the IDAC 204. Details of one embodiment of the first IDAC 204 are provided below with respect to FIG. 5. The output of the CWT circuit 202 is intended to produce a constant current over temperature in a like-sized device to 508 (i.e., current $V_{ref}/R$ is constant over temperature if the reference voltage source 502 and resistance 510 are constant with temperature). $V_{CWT}$ is coupled to the first IDAC 204 and used within the IDAC to generate a digitally scaled current.

The scaling factor is based on the value of an n-bit wide digital control signal coupled to the first IDAC 204 over n parallel signal lines 210. The value of the digital control signal applied to the first IDAC 204 is generated by a control processor 212. In other embodiments, the digital control signal provided to the first IDAC 204 is provided over one line through a serial interface to the IDAC 204, rather than in parallel over n signal lines. Furthermore, in other embodiments, the output from the CWT circuit 202 is a current rather than a voltage. In some embodiments, a current within the IDAC is digitally scaled, as will be discussed in more detail below with regard to FIG. 5.

The digitally scaled current is output from the first IDAC 204. In some embodiments, the circuit 200 provides a bias to an amplifier 201. In some such embodiments, the bias is a current; however, in others the bias is a voltage. Those skilled in the art will appreciate that an output current can be converted to a voltage, and vice versa. For the sake of simplicity, at least some of the discussed provided below assumes that the output of the circuit 200 is a current. However, the discussion applies equally to a circuit 200 in which the output is a voltage.

The circuit 200 also comprises a PTAT circuit 214. Details of the PTAT circuit operation will be discussed below with regard to FIG. 6. The PTAT circuit 214 provides an output to a second IDAC 220. The output voltage $V_{PTAT}$ would induce a current that is proportional to the ambient temperature of the PTAT circuit 214. Alternatively, the output of the PTAT circuit may be a PTAT current. The output is provided on a signal line 216. The output is used to generate a scaled output current $I_{PTAT}$. $I_{PTAT}$ is output from the second IDAC 220 and summed with $I_{CWT}$. In some embodiments, the output of the second IDAC 220 is controlled in response to an m-bit value 211 coupled to the IDAC 220 from the control processor 212.

By adjusting the relative scaling of the outputs from the two IDACs 204, 220, the temperature coefficient of the current $I_{out}$ can be set to a value that is dependent on the scaling of each of the IDAC outputs. That is, if all of the current is being provided by the IDAC 204, then the output current $I_{out}$ will have a zero temperature coefficient (there is no change in current over temperature assuming that the resistor 510 has a zero temperature coefficient). It should be noted that in practical applications, the temperature coefficient of the resistor 510 will typically be close to zero. That is, typically, the ideal of a zero temperature coefficient may be difficult to achieve. In contrast, if all of the current is being provided by the IDAC 220, then the temperature coefficient will be equal to that temperature coefficient of the PTAT circuit, which will be much greater than that of the IDAC 204.

Figure 3:
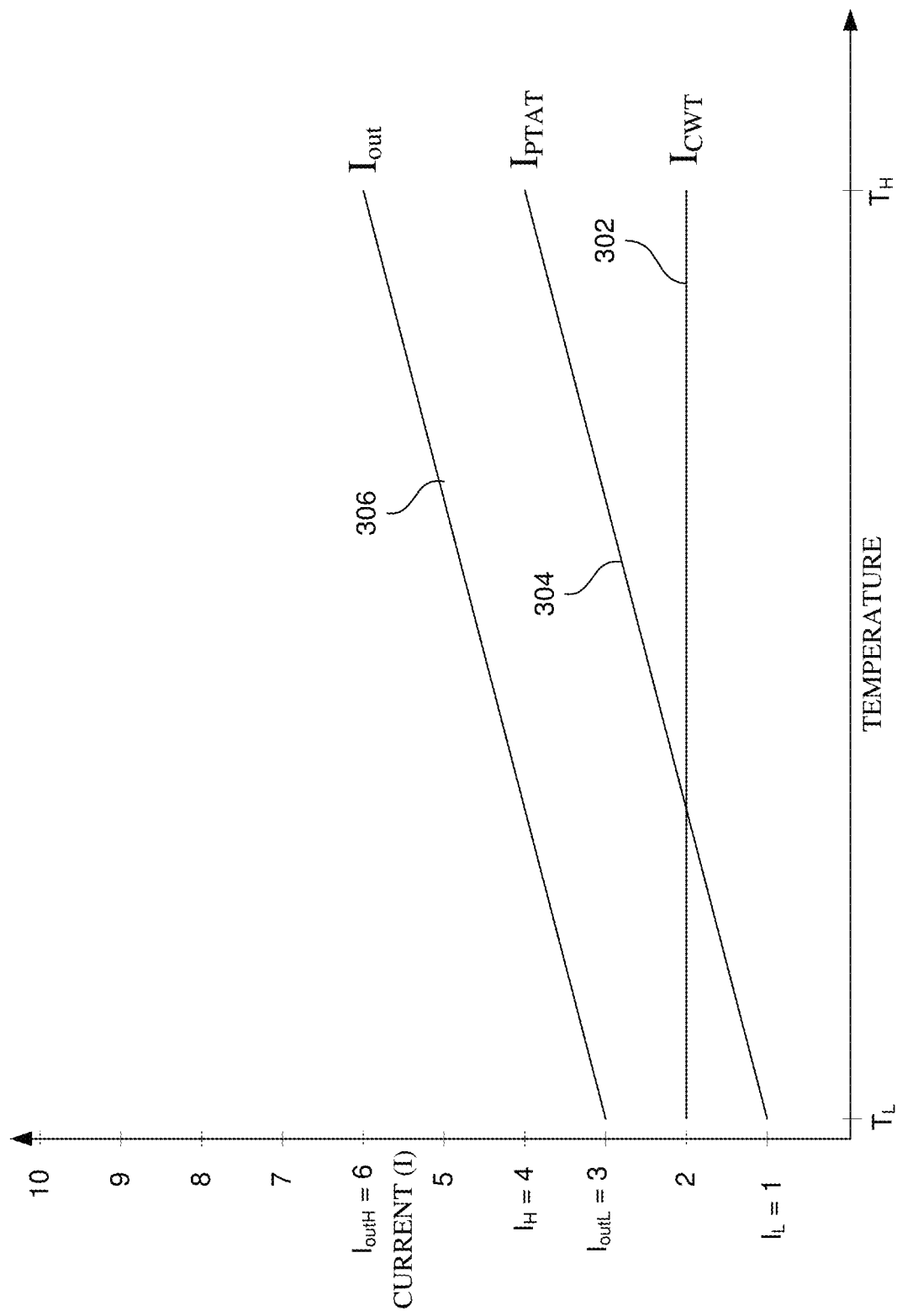
FIG. 3 shows a plot of the currents $I_{CWT}$ and $I_{PTAT}$ output from each of two IDACs.

FIG. 3 shows a plot of the currents $I_{CWT}$ 302 and $I_{PTAT}$ 304 output from each of the two IDACs 204, 220, respectively. The plot 302 of the current $I_{CWT}$ is flat (constant current) over temperature. The plot 304 of the current $I_{PTAT}$ has a positive slope, illustrating that for increasing temperature, there is a proportional increase in current $I_{PTAT}$. It should be noted that the temperature coefficient is measured as a relative change in current from a first current $I_{TL}$ at a relatively low first temperature $T_L$ to a second current $I_{TH}$ at a relatively high second temperature $T_H$. An arbitrary relative value in units that are not defined is used in the example of FIG. 3 for clarity. It should be understood that the units are not defined so that it is clear that the particular current values are not significant for the purpose of this discussion. Furthermore, the temperature coefficient shown in this example is exaggerated to more clearly illustrate the point. As shown in FIG. 3, the temperature coefficient of the output current $I_{PTAT}$ from the IDAC 220 is the ratio of $I_H/I_L$=4/1=4=TCptat (temperature coefficient of $I_{PTAT}$), where $I_L$ is the $I_{PTAT}$ current at temperature $T_L$ and $I_H$ is the $I_{PTAT}$ current at temperature $T_H$. When the current $I_{PTAT}$ is summed with the current $I_{CWT}$, the temperature coefficient of the total current $I_{out}$ is equal to the ratio of $I_{outH}/I_{outL}$=6/3=2=$TC_{out}$ (temperature coefficient of the output current out. The line 306 shows the current versus temperature curve for $I_{out}$. Therefore, it can be seen that summing the $I_{PTAT}$ with the $I_{CWT}$ reduces the temperature coefficient of the total current $I_{out}$. The greater the contribution of the $I_{CWT}$ to the total current $I_{out}$, the lower the temperature coefficient of the total current $I_{out}$ will be. By scaling the currents $I_{CWT}$, $I_{PTAT}$ output from each of the two IDACs, 204, 220, the relative contribution of the each can be controlled.

Figure 4A:
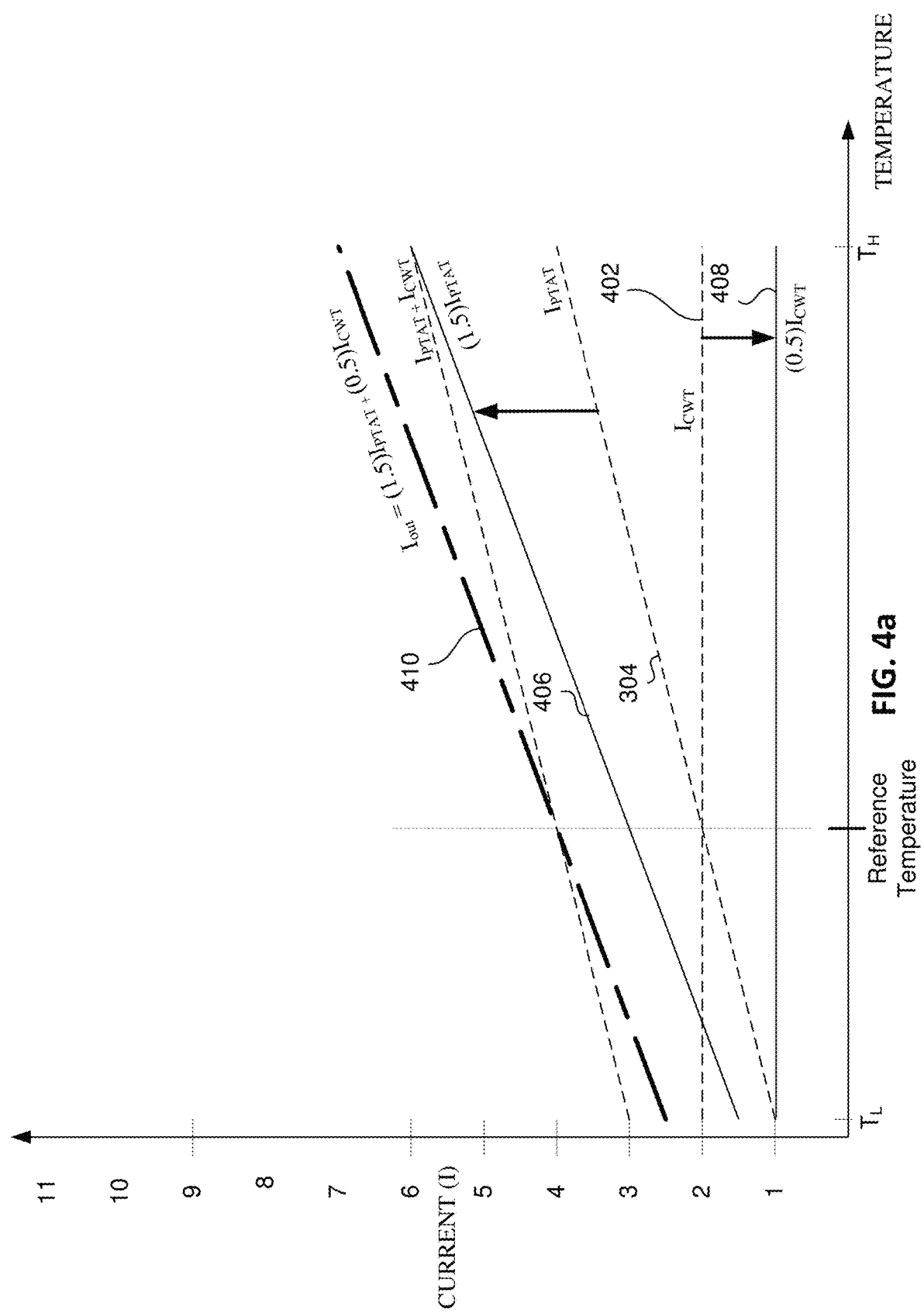
FIG. 4a shows a plot in which "scaled $I_{PTAT}$" has been scaled upward by a first IDAC and "scaled $I_{CWT}$" has been scaled down by a second IDAC.

FIG. 4a shows the effect of scaling the $I_{PTAT}$ up and the $I_{CWT}$ down. A first dotted line shows a plot of the unscaled current $I_{CWT}$ 402. A second dotted line shows a plot of the current $I_{PTAT}$ 304. A first solid line 406 is a plot of the scaled current, $I_{PTAT}$ 406. The line 406 shows that the current $I_{PTAT}$ has been scaled up by the IDAC 220. A second solid line 408 is a plot of the scaled output current, $I_{CWT}$ showing that the current $I_{CWT}$ has been scaled down by the IDAC 204. Both the magnitude and the slope of scaled $I_{PTAT}$ 406 increase with a scaling of greater than 1. Nonetheless, the temperature coefficient of scaled $I_{PTAT}$ 406 remains the same as the temperature coefficient of $I_{PTAT}$ 404, as will be seen from the following example. However, as will be seen from the example below, when the $I_{PTAT}$ is scaled by a factor that is greater than the scaling factor of the $I_{CWT}$, the temperature coefficient of the sum of the scaled currents $I_{CWT}$ and $I_{PTAT}$ is greater than the temperature coefficient of the sum of the unscaled currents $I_{CWT}$ and $I_{PTAT}$. Conversely, when the $I_{PTAT}$ is scaled by a factor that is less than the scaling factor of the $I_{CWT}$, the temperature coefficient of the sum of scaled $I_{CWT}$ and $I_{PTAT}$ will be relatively lower. By holding the magnitude of the output current constant at a predetermined reference temperature as the $I_{PTAT}$ and $I_{CWT}$ are scaled, a proper amplifier bias will be maintained as the temperature coefficient of the bias is adjusted to compensate for temperature effects on the $g_m$ of the FETs in the amplifier.

Looking more closely at FIG. 4a, the current $I_{PTAT}$ 304 at the temperature $T_L$ has a magnitude of 1. At a temperature of $T_H$ the current $I_{PTAT}$ 304 has a magnitude of 4. Therefore, the temperature coefficient is 4/1=4. The $I_{PTAT}$ when scaled by a factor of 1.5 has a magnitude of 1.5 at the low temperature $T_L$, and a magnitude of 6 at the high temperature $T_H$. Therefore, the temperature coefficient of scaled $I_{PTAT}$ 406 is 6/1.5=4 (i.e., remains constant as the $I_{PTAT}$ is scaled). Scaling $I_{CWT}$ by a factor of 0.5 shifts the magnitude of the current $I_{CWT}$ 402 down to a constant magnitude of 1.

The sum of scaled $I_{PTAT}$+scaled $I_{CWT}$ is a current $I_{out}$ 410 that has a magnitude at temperature $T_L$ of 1.5+1=2.5 and a magnitude at temperature $T_H$ of 6+1=7. Therefore, the temperature coefficient is 7/2.5=2.8. Recalling that the temperature coefficient for the sum of the unscaled $I_{PTAT}/I_{CWT}$=2, it can be seen that scaling the $I_{PTAT}$ up and the $I_{CWT}$ down results in an increased temperature coefficient for $I_{out}$.

Figure 4B:
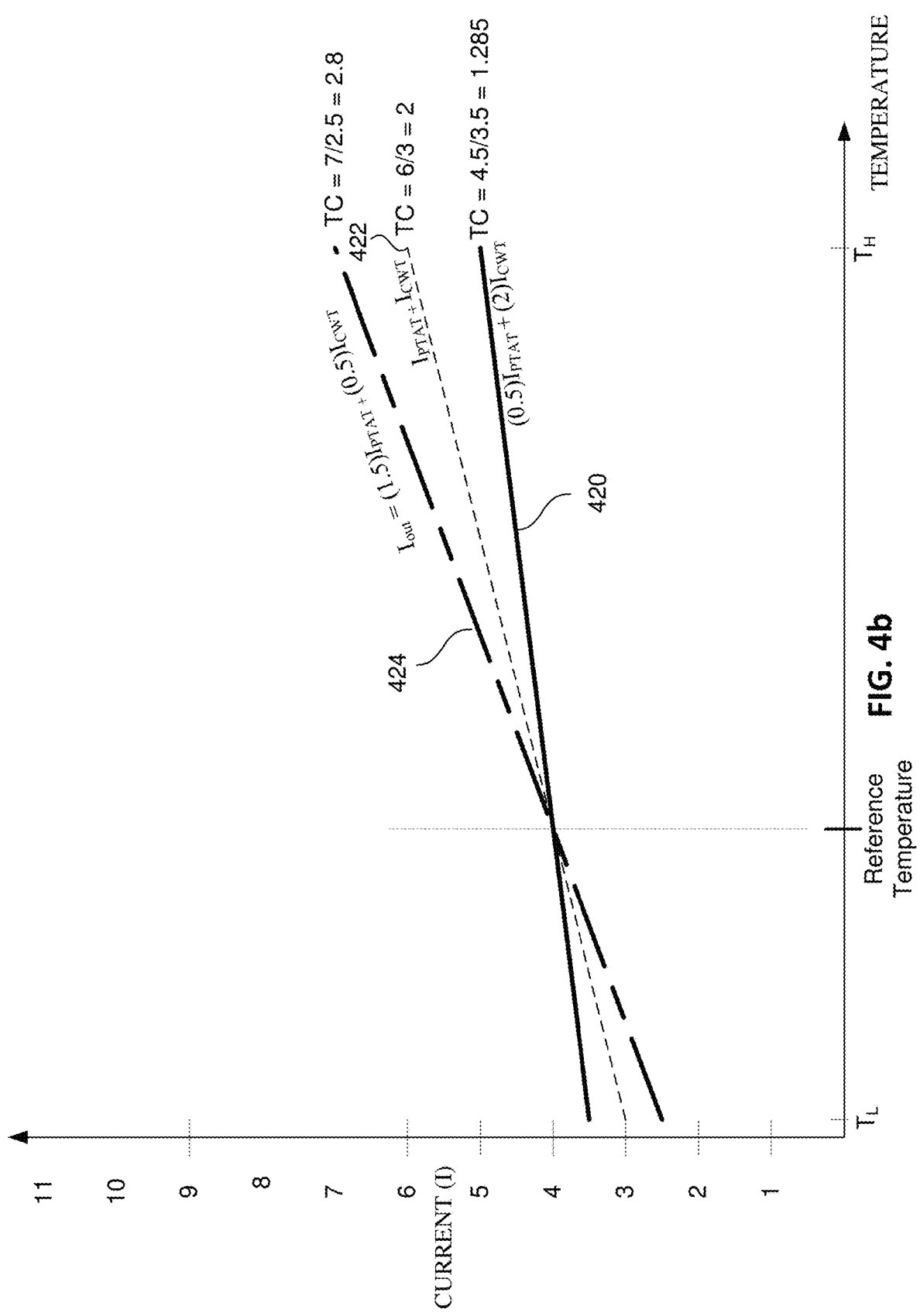
FIG. 4b shows the effect of three different sets of scaling factors applied to $I_{PTAT}$ and $I_{CWT}$ to form three different output currents $I_{out}$. A first line shows a scaling factor of 0.5 applied to $I_{PTAT}$ and a scaling factor of 2 applied to $I_{CWT}$.

FIG. 4b shows the effect of three different sets of scaling factors applied to $I_{PTAT}$ and $I_{CWT}$ to form three different output currents $I_{out}$. A first line 420 shows a scaling factor of 0.5 applied to $I_{PTAT}$ and a scaling factor of 2 applied to $I_{CWT}$. The resulting temperature coefficient is approximately 1.285. A second line 422 shows a scaling factor of 1 applied to each of $I_{PTAT}$ and $I_{CWT}$. The resulting temperature coefficient is 2. A third line 424 shows a scaling factor of 1.5 applied to $I_{PTAT}$ and a scaling factor of 0.5 applied to $I_{CWT}$. The resulting temperature coefficient is 2.8.

These examples of different scaling factors show that taken together, the two IDACs 204, 220 can be used to set the temperature coefficient of the bias current produced by the circuit 200, as desired, while maintaining a constant bias current at the reference temperature. It should be noted that it is not necessary to maintain the bias current constant at the reference temperature. However, it is assumed that the desired gain is set to a level determined for the amplifier at the reference temperature. Using the scaling provided by the two IDACs allows "trimming" of the bias current (setting the temperature coefficient) to ensure that changes of bias current over temperature offset changes in $g_m$ of the amplifier gain device without using a "like-kind" device in the circuit 200.

Figure 5:
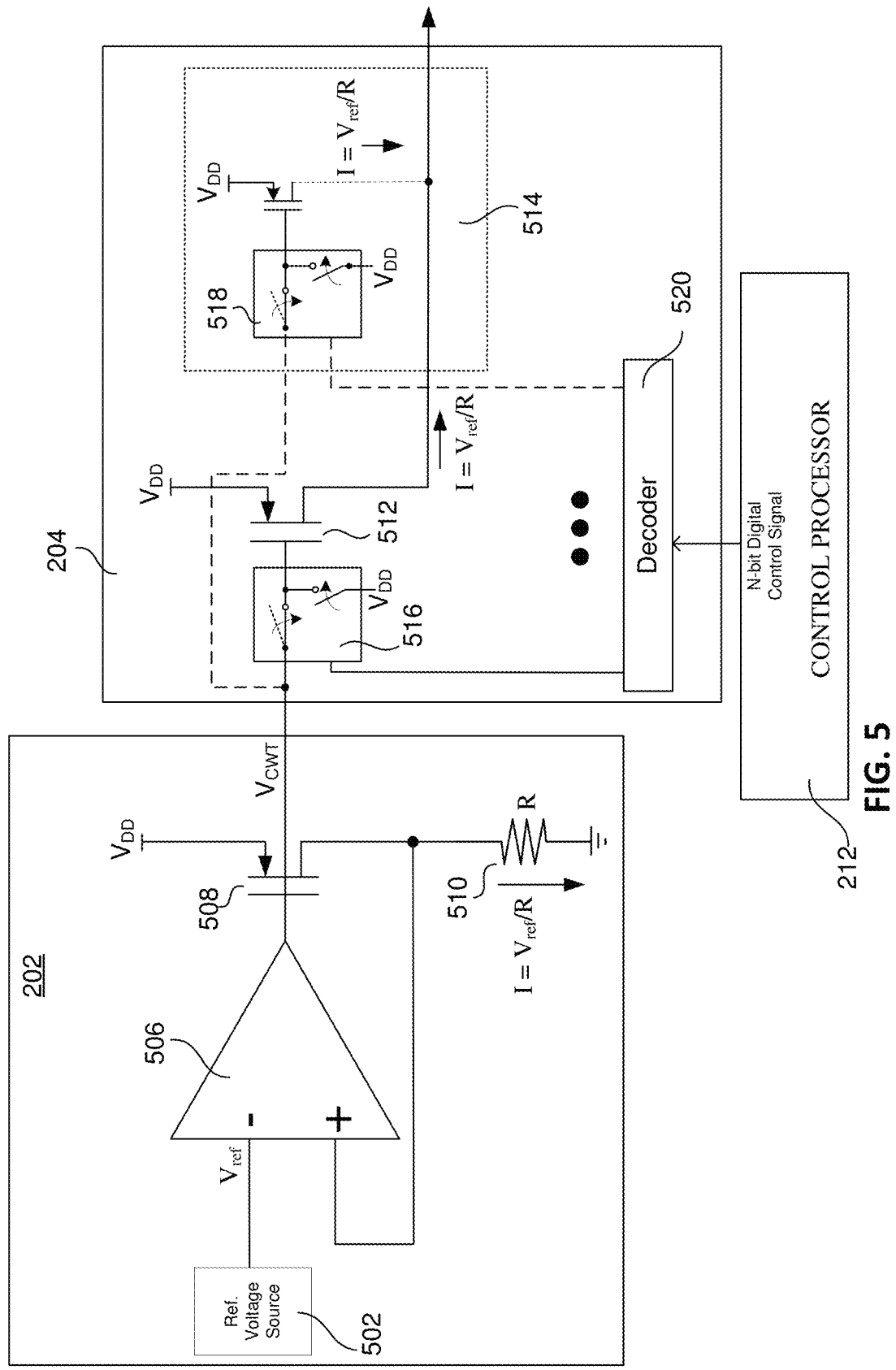
FIG. 5 is a schematic of one embodiment of a CWT circuit.

FIG. 5 is a schematic of one embodiment of a CWT circuit 202 and an associated external device, such as the IDAC 204. Alternative embodiments of the disclosed method and apparatus may implement the CWT circuit using one of several well-known circuits for providing a current or voltage that is constant with temperature. Any CWT circuit may be used. The particular CWT circuit 202 merely illustrates one such CWT circuit.

The CWT circuit 202 provides a voltage (Vent) to create a current $I=V_{ref}/R$ that is constant with temperature to the IDAC 204. A reference voltage source 502 providing a reference voltage is coupled to the inverting input of an operational amplifier 506. The output of the operational amplifier 506 is coupled to the gate of a FET 508. The source of the FET 508 is coupled to the voltage source $V_{DD}$. The drain of the FET 508 is coupled to the non-inverting input of the operational amplifier 506. A resistor 510 is coupled between the drain of the FET 508 and ground. The operational amplifier 506 ensures that the current that flows through the FET 508 establishes a voltage $V_{ref}$ at the drain of the FET 508 (i.e., at the non-inverting input to the operational amplifier 506) that is equal to the voltage $V_{ref}$ provided to the inverting input of the operational amplifier 506. Coupling the gate of the FET 508 to the gate of a FET 512 within the IDAC 204 establishes a current mirror that provides the IDAC 204 with a stable constant current over a desired temperature range.

Several additional current mirrors 514 can be provided in the IDAC 204. Each such current mirror is controllable (i.e., can be turned on/off) by switches 516, 518. One such additional current mirror 514 is shown for the sake of simplicity. The dashed box around the additional current mirror 514 indicates that several such additional current mirrors 514 may be present within the IDAC 204. The total current output from the IDAC 204 can be controlled to provide an output current that is equal to the current that flows through the FET 508, scaled by (i.e., multiplied by) the number of current mirrors that are "turned on" and that are summed together at the output. It should be noted that if the FETs of each current mirror in the IDAC 204 are matched to the FET 508 in the CWT circuit 202, then the scaling factor will be equal to the number of current mirrors that are conducting (i.e., turned on).

Other scaling factors can be attained by varying the relationship between the FETs in the various current mirrors of the IDAC 204. For example, the FETs can be selected to provide a current that is a binary factor of the reference current provided by FET 508. Accordingly, the first current mirror would provide a current equal to the current flowing in FET 508. A second current mirror would provide a current that is twice the current of the FET 508. A third current mirror would provide a current that is twice that of the second current mirror, etc. Other relationships between the FETs of the IDAC current mirrors and the FET 508 can be used as well, including having one or more current mirrors implemented with FETs that are smaller than the FET 508, and thus provide less current than flows through the FET 508 in order to scale down the IDAC output current.

In some embodiments, control of the plurality of current mirrors is based on the value of the n-bit digital control signal provided to the IDAC 204 by the control processor 212. A decoder 520 receives the n-bit signal and provides individual control lines out to activate the appropriate current mirrors 514. In some embodiments, each current mirror is turned on or off by controlling switches 516, 518. For example, switches 516 can be controlled to disconnect the gate of the FET 512 from the drive (thus removing the drive to the FET 512) and short the gate to $V_{dd}$ (thus ensuring that the FET 512 is does not conduct). The switches 516, 518 are controlled by the outputs of the decoder 520.

Figure 1:
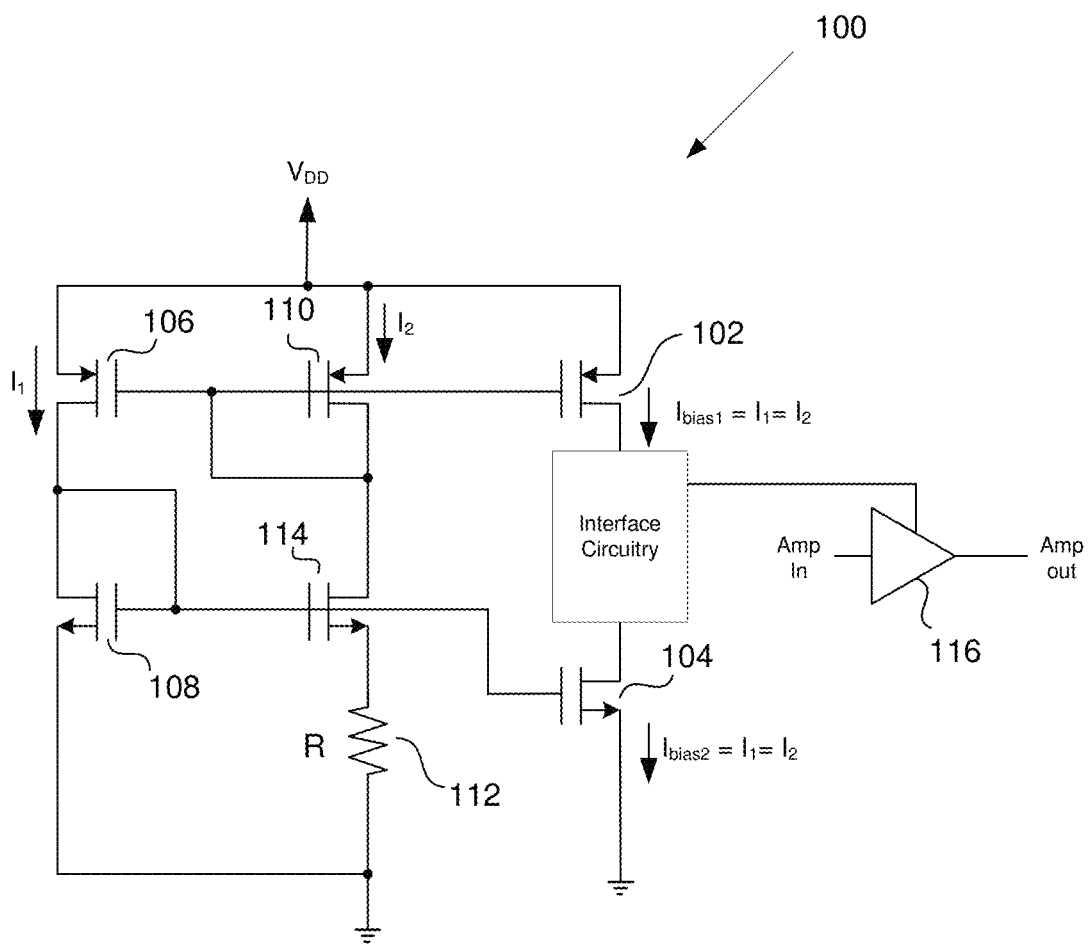
FIG. 1 is a simplified schematic of one circuit 100 used to assist in maintaining constant $g_m$.
Figure 6:
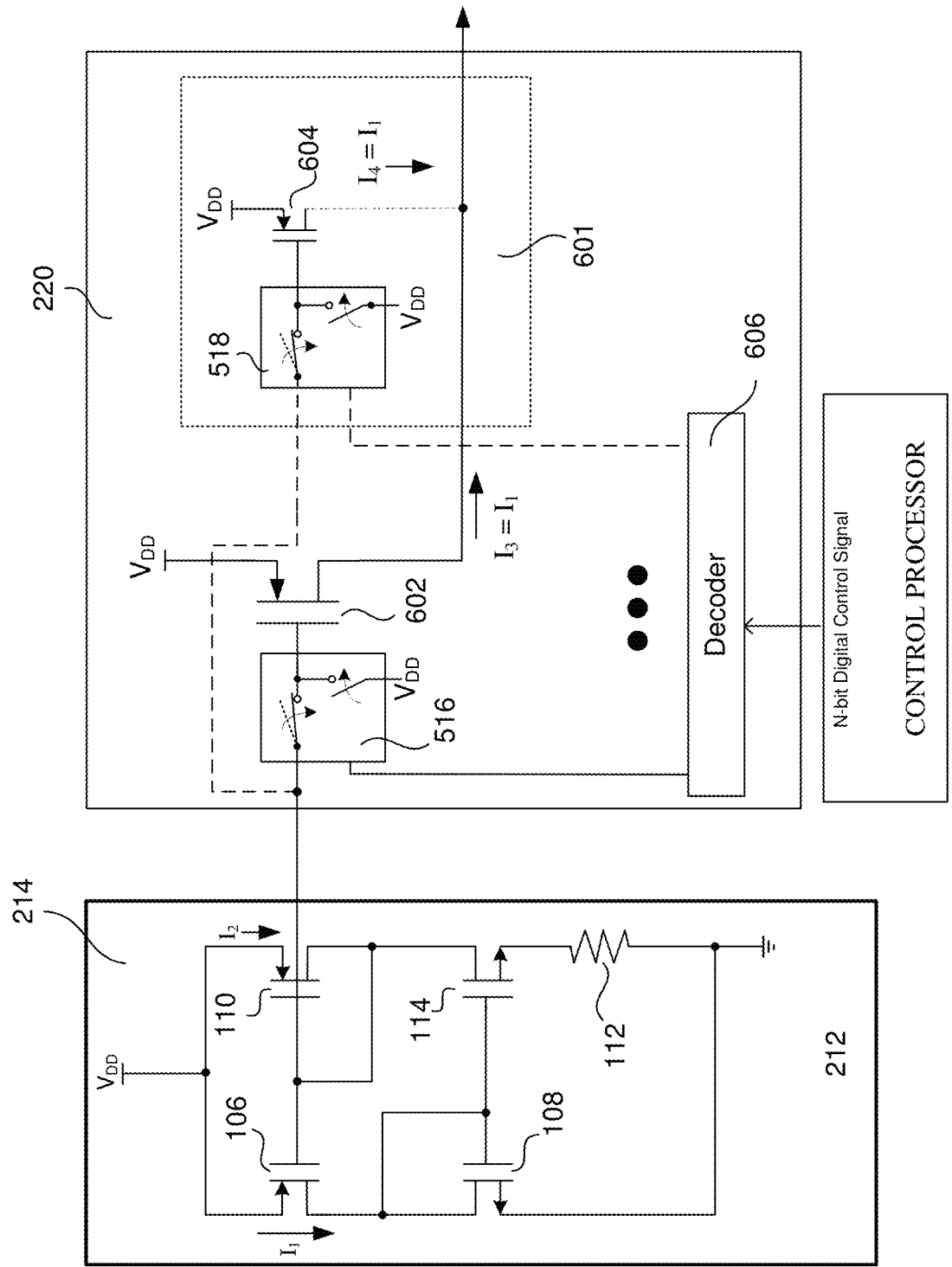
FIG. 6 is a schematic of a PTAT circuit coupled to an external device, such as the IDAC shown in FIG. 2.

FIG. 6 is a schematic of a PTAT circuit 214 coupled to an external device, such as the IDAC 220 shown in FIG. 2. The PTAT circuit 214 operates essentially the same as the PTAT circuit 100 shown in FIG. 1. As noted above with respect to the PTAT circuit 100 of FIG. 1, the currents that flow through the FETs 110 and 114 are proportional to the change in the $g_m$ of the FET 108. A current $I_3$ flows through the FET 602 and a current $I_4$ flows through the FET 604. The currents $I_3$ and $I_4$ match the current $I_2$ that flows through the FETs 110, 114. In some embodiments, several additional current mirrors 601 within the IDAC 220 are driven with the gate voltages of the FET 110. Each current mirror within the IDAC 220 can be turned on/off under the control of the n-bit digital control signal provided to the IDAC 204 by the control processor 212. In some embodiments, similar to the IDAC 204 discussed above with respect to FIG. 5, each current mirror is controlled by disconnecting the gate of the FETs in the current mirror to be controlled (thus removing the drive to the current mirror) and shorting the gate to $V_{dd}$ for the PMOS FETs (thus turning the current mirror off). Switches 516, 518 selectively connect to the gates of the FETs 602, 604 to either the respective gate voltages output from the PTAT circuit 214 or to $V_{dd}$ under the control of the n-bit digital control signal as decoded by a decoder 606. The currents that flow through the current mirrors are summed at the output of the IDAC 220. Therefore, a scaled output current equal to the current of each current mirror times the number of current mirrors that are turned on is output from the IDAC 220. Accordingly, the output current from the IDAC 220 is scaled by a factor equal to the number of current mirrors that are on. In addition, the output current is proportional to the current of the PTAT circuit $I_1$. In other embodiments, an IDAC similar to the IDAC 220 shown can be driven by the gate voltage of the FET 114. In that case, the FETs in the IDAC are NMOS FETs having their source to ground, rather than PMOS FETs with the source coupled to $V_{dd}$. In that case, the switches 516, 518 would be coupled to ground instead of $V_{dd}$.

Figure 7:
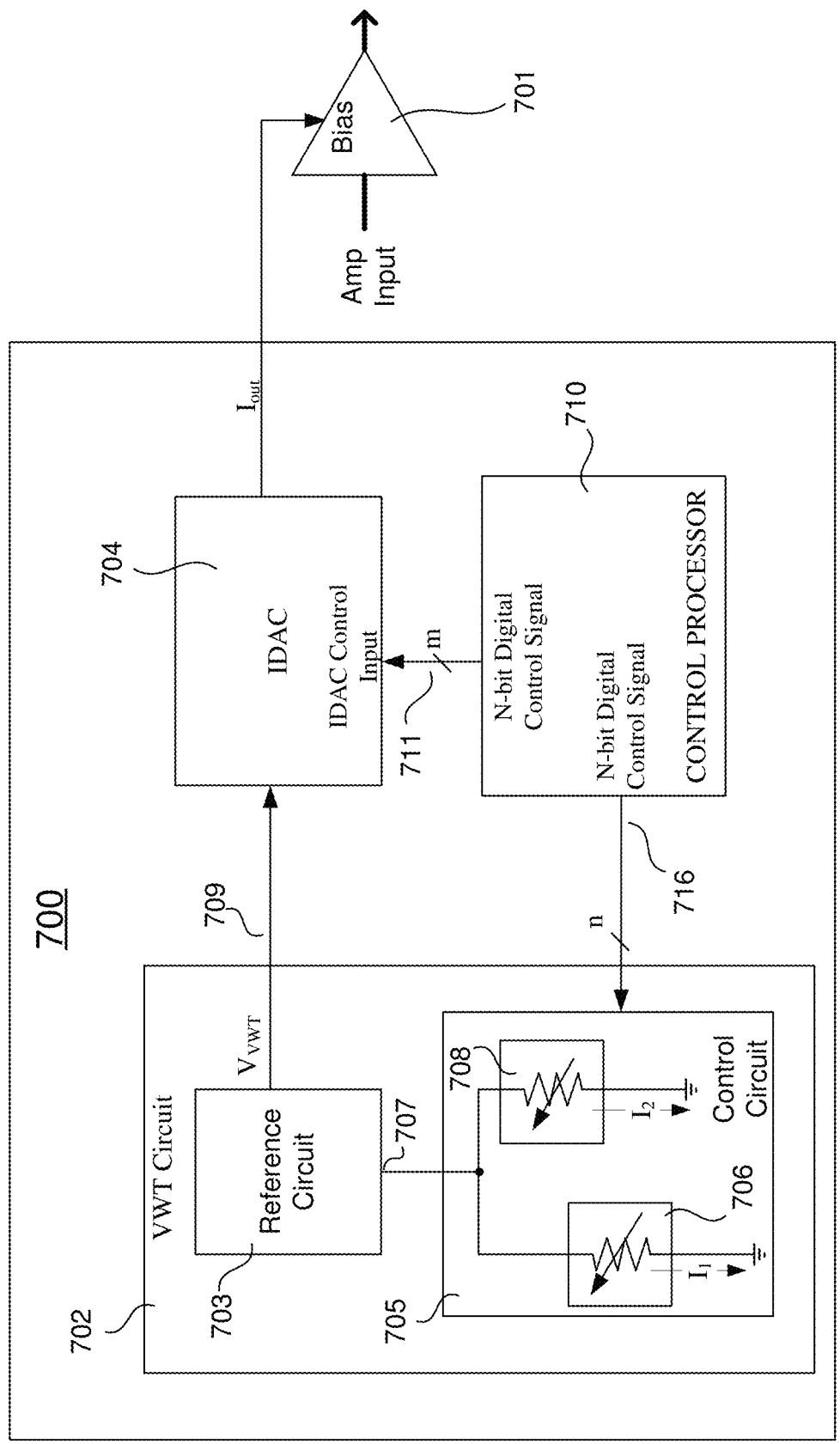
FIG. 7 is a simplified block diagram of a controllable temperature coefficient bias circuit in accordance with another embodiment of the disclosed method and apparatus.

FIG. 7 is a simplified block diagram of a controllable temperature coefficient bias circuit 700 in accordance with another embodiment of the disclosed method and apparatus. In some embodiments, the circuit 700 provides a bias to an amplifier 701. In some such embodiments, the bias is a current, however in others, the bias is a voltage. Those skilled in the art will appreciate that an output current can be converted to a voltage, and vice versa. For the sake of simplicity, the discussion provided below assumes that the output of the circuit 700 is a current. However, the discussion applies equally to a circuit 700 in which the output is a voltage.

The controllable temperature coefficient bias circuit 700 has two independent controls. A first control signal 716 sets the slope of the temperature coefficient of the current output from the bias circuit 700. A second control signal 711 controls the current that is output by the bias circuit 700 at the predetermined reference temperature. In some embodiments, these two control signals 716, 711 are set by a control processor 710. Details of the manner in which each of these two control signals 716, 711 work to provide independent control of the output current are provided below.

The circuit 700 comprises a variable with temperature (VWT) circuit 702, an IDAC 704 and a control processor 710. The VWT circuit 702 comprises a reference circuit 703 (discussed in greater detail below with regard to FIG. 8) and a control circuit, such as a current control circuit 705. The reference circuit 703 comprises a control port 707. The current control circuit 705 comprises a first current control element (such as a first variable resistor circuit (VRC)) 706 and a second current control element (such as a second VRC) 708. Each current control element (e.g., VRC 706, 708) has a "controllable" resistance that is controllable in response to the first of the two control signals 716. In some embodiments, the first control signals 716 is an n-bit digital control signal provided from the control processor 710. The "reference" resistance is the resistance of the VRC 706, 708 at a reference temperature. In some embodiments, the two VRCs 706, 708 are controlled by the same n-bit digital control signal 716. Alternatively, each VRC 706, 708 is independently controlled by a different n-bit digital control signal. In some such embodiments, the number of bits n may be different for the control signals to each VRC 706, 708. In addition, in other embodiments, the control signal can be a serial data input or an analog signal.

In some embodiments, one of the two VRCs 706, 708 has a relatively high temperature coefficient and one has a relatively low temperature coefficient. The temperature coefficient of the VRC 706, 708 is the ratio of the change in resistance, ΔR to a change in temperature ΔT. Accordingly, changes in the resistance in response to changes in temperature are greater for one of the VRCs 706, 708 then for the other.

In some embodiments, the controllable resistance of one or both of the VRCs 706, 708 vary linearly in response to the control signal (i.e., each increment of the digital control signal generated by the control processor 710 increases/decreases the resistance of the device by an equal amount). Alternatively, the resistance of at least one of the VRCs 706, 708 may vary non-linearly (i.e., logarithmically, etc.). Those skilled in the art will be aware of several architectures for implementing such VRCs.

In some embodiments, when the n-bit digital control signal 716 increases, the controllable resistance of one of the VRC 708 increases and the controllable resistance of the other VRC 706 decreases. In some such embodiments, the "total resistance" of the current control circuit 705 remains relatively constant at a reference temperature, independent of the value of the n-bit digital control signal 716. Accordingly, changing the value of the n-bit digital control signal 716 results in the change in the controllable resistance of one VRC 706 offsetting the change in the controllable resistance of the other VRC 708. Therefore, for any setting of the n-bit digital control signal 716, the current through the current control circuit will remain constant. However, the ratio of the current that flows through the VRC 706 with respect to the current that flows through the VRC 708 will change under the control of the first control signal 716.

Figure 8:
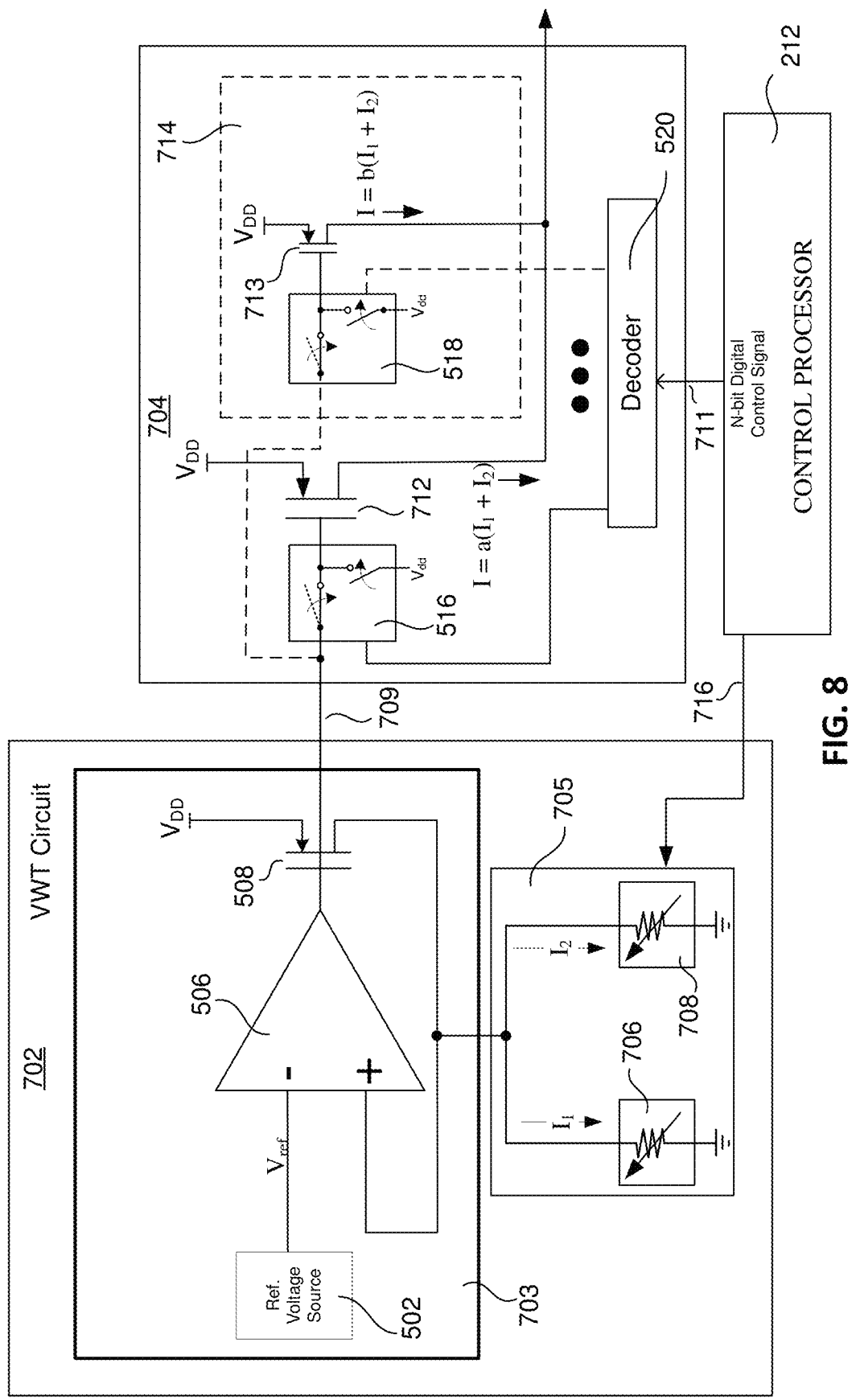
FIG. 8 is a schematic showing the reference circuit and IDAC in greater detail.

FIG. 8 is a schematic showing the VWT circuit 702 and IDAC 704 in greater detail. It should be noted that the schematic of FIG. 8 is nonetheless, still a simplified schematic provided merely to explain the operation of some embodiments of the disclosed method and apparatus. For example, control signal 716 for controlling the VRCs 706, 708 within the current control circuit 705 is shown only as coupled to the current control circuit 705 and control lines for controlling the switches 516, 518 within the IDAC 704 are not shown in FIG. 8 for the sake of simplicity.

The VWT circuit 702 operates similar to the CWT circuit 202 of FIG. 5. However, rather than the fixed resistor 510 of the CWT 202, the reference circuit 703 of the VWT circuit 702 comprises a control port 707 coupled to the two VRCs 706, 708. The control signal 716 controls the ratio of the resistance of the VRCs 706, 708. By controlling the ratio of the resistance of the VRCs while keeping the total resistance of the control circuit 705 constant, the VWT circuit 702 can generate an output voltage or current having a temperature coefficient that can be adjusted at an output 709 of the VWT circuit 702 in response to the first control signal 716. That is, the slope of the current that flows through the FET 508 over temperature (i.e., the temperature coefficient) can be adjusted while maintaining the same amount of current at the reference temperature. The current that flows through the FET 508 can then be coupled directly to the IDAC 704 or can be used to generate a voltage that is coupled to the IDAC 704. Similar to the case noted above with respect to FIG. 5, the voltage at the non-inverting input will be maintained constant by the operational amplifier 506. Therefore, variations in the resistance from the drain of the FET 508 to ground will result in a proportional change in the current that flows from drain to source in the FET 508. In some embodiments, the reference voltage $V_{ref}$ from 502 may also be proportional to temperature.

Controlling the controllable resistances of the VRCs 706, 708 provides a mechanism to control the relative contribution of the unique temperature coefficients of each VRC 706, 708 to the total resistance between the source of the FET 508 and ground. That is, controlling the relative resistance of each VRC 706, 708, and so controlling the relative contribution of current that flows through each VRC 706, 708, provides a mechanism to set the temperature coefficient of a reference current output from the VWT circuit 702. The output current can be used, for example, to provide a controllable temperature coefficient bias to an amplifier that has a temperature coefficient that can be as large as the temperature coefficient of the VRC 708 or as small as the temperature coefficient of the VRC 706, or anywhere in between. In some embodiments in which the output of the VWT circuit 702 is coupled to an IDAC 704 that can scale the output current, a separate second control signal 711 can control the magnitude of the output current at the reference temperature. The output current from the IDAC 704 can therefore be set to have a temperature coefficient that matches the temperature coefficient of the amplifier gain device (i.e., has the inverse slope) and a magnitude that provides the desired gain for the amplifier.

Scaling of the output current by the IDAC 704 is performed in a manner that is similar to that noted above with respect to the IDAC 220. That is, the gate of a FET 712 within the IDAC 704 is coupled to the gate of the FET 508 to mirror the current in the FET 508. The relative size of the FET 712 determines the proportionality "a" between the current flowing through the FET 508 and the current flowing through the FET 712. The resulting current can be mirrored in several additional FETs 713 in the IDAC 704, similar to the IDACs 220, 204 discussed above. A proportionality "b" is determined by the size of each additional FET 713.

The FET 713 in each current mirror 714 is selectively enabled in response the second control signal 711 to set a scaling factor received at the IDAC 704, similar to the case described above with regard to the IDACs 220, 204. The scaling factor determines the reference current that flows through the FET 508 of the VWT circuit 702. Accordingly, the current output from the IDAC 704 can be scaled by a factor equal to the number of current mirrors that are selectively enabled and summed at the output of the IDAC 704. It should be noted that the scaling factor will be equal to the number of current mirrors that are selectively enabled, if the FET of each current mirror in the IDAC 704 is matched to the FET 508 in the VWT circuit 702 (i.e., the proportionality a=b=1). That is, if each FETs 712, 713 are matched to the FET 508, then the current output from the IDAC 704 will be a multiple of the current in the FET 508, where the multiple is equal to the number of current mirrors that are selectively enabled. Other scaling factors can be attained by varying the relationship (i.e., the proportionality) between the FETs 712, 713 of the various current mirrors in the IDAC 704 and the FET 508, similar to the manner discussed above with respect to FIG. 5, regarding to the relationships between the FETs of the current mirrors in the IDAC 204 and the FET 508. In some embodiments, the second control signal 711 is an m-bit digital signal, the magnitude of which determines the number of current mirrors that are selected to be active.

Figure 9:
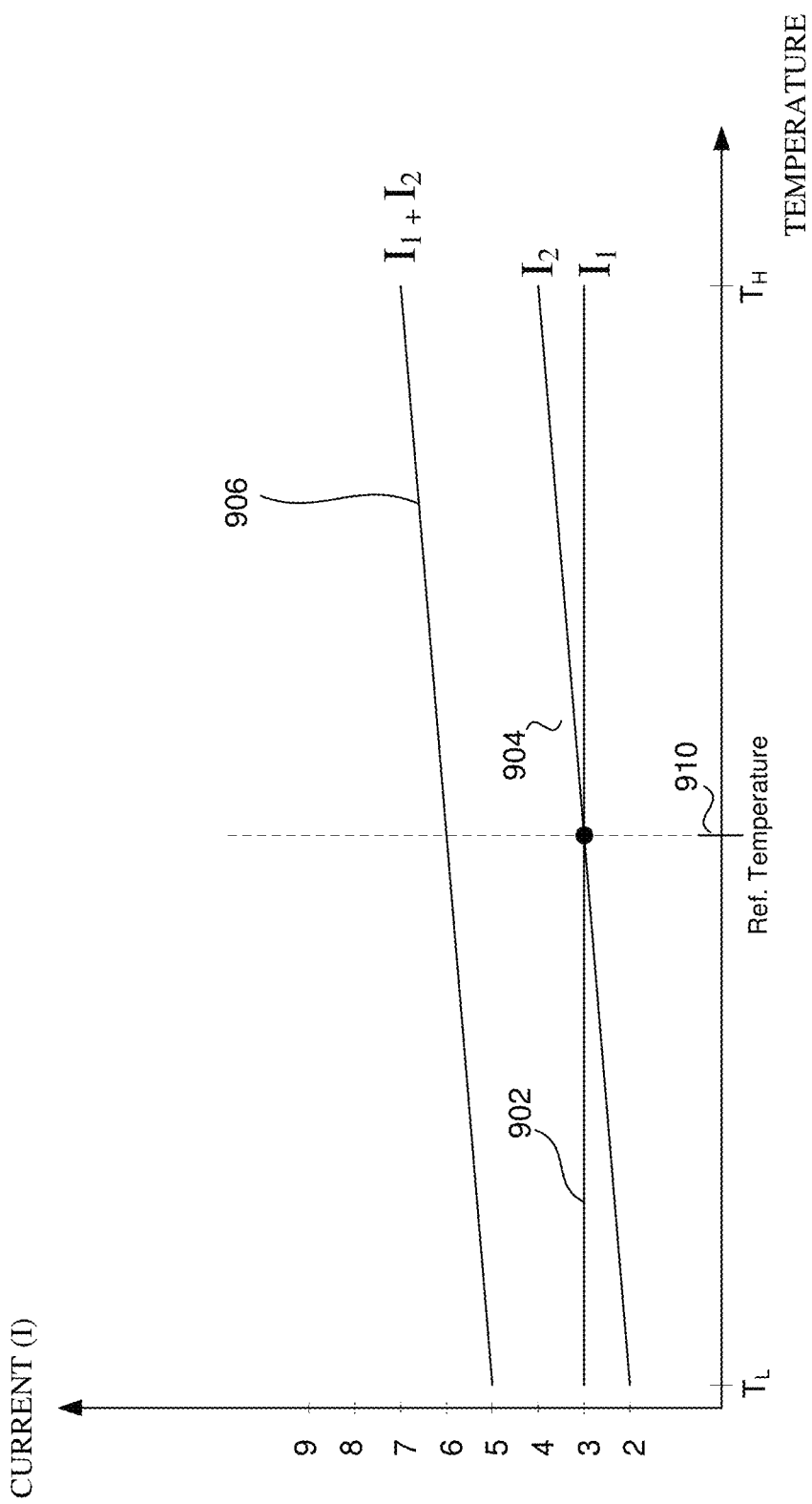
FIG. 9 is a plot of example currents versus temperature for current $I_1$ and $I_2$ that flow through the two variable resistor circuits of FIGS. 7 and 8.

FIG. 9 is a plot of current verses temperature. A first line 902 shows one example in which the current $I_1$ that flows through a first of the two VRCs 706 is constant as the temperature changes. That is, in the example shown in FIG. 9, the first VRC 706 has a zero temperature coefficient (constant over temperature). Therefore, the current $I_1$ has a constant magnitude of 3 as the temperature changes over a range from $T_L$ to $T_H$. The particular values of current shown in FIG. 9 are provided without mention of a unit of measure to allow for a discussion of the relative values of current. The values are not intended to imply any particular absolute magnitude of current.

A second line 904 shows the amount of current $I_2$ that flows through the second of the two VRCs 708 as the temperature changes over the range from $T_L$ to $T_H$. The second VRC 708 has a relatively high negative temperature coefficient of resistance. Therefore, the line 904 has a positive slope in current. The current increases from 3 at a temperature of $T_L$ to 5 with at a temperature of $T_H$ for the VRC 708. It should be noted that the temperature coefficient (i.e., the slope of the line 902) depicted is merely an illustration of the concept. Selection of the appropriate temperature coefficient is a matter to be determined based on the particular implementation of the disclosed method and apparatus. In particular, the particular temperatures $T_L$ and $T_H$ are not assigned, since their values are implementation dependent and are not relevant to an understanding of the disclosed method and apparatus.

In the example shown in FIG. 9, the reference resistance of the VRCs 706, 708 are set to provide equal amount of current $I_1$ and $I_2$ (i.e., equal to) through the VRCs 706, 708 at the reference temperature 910. Therefore, at the reference temperature 910, the sum of $I_1+I_2=I_{out}=6$. The total current $I_{out}$ at the low temperature $T_L$ is equal to 5 and at the high temperature $T_H$ is equal to 7. Accordingly, the temperature coefficient with both currents equal at the reference temperature is 7/5=1.4, i.e., the ratio of current $T_H$ to current at $T_L$.

Figure 10:
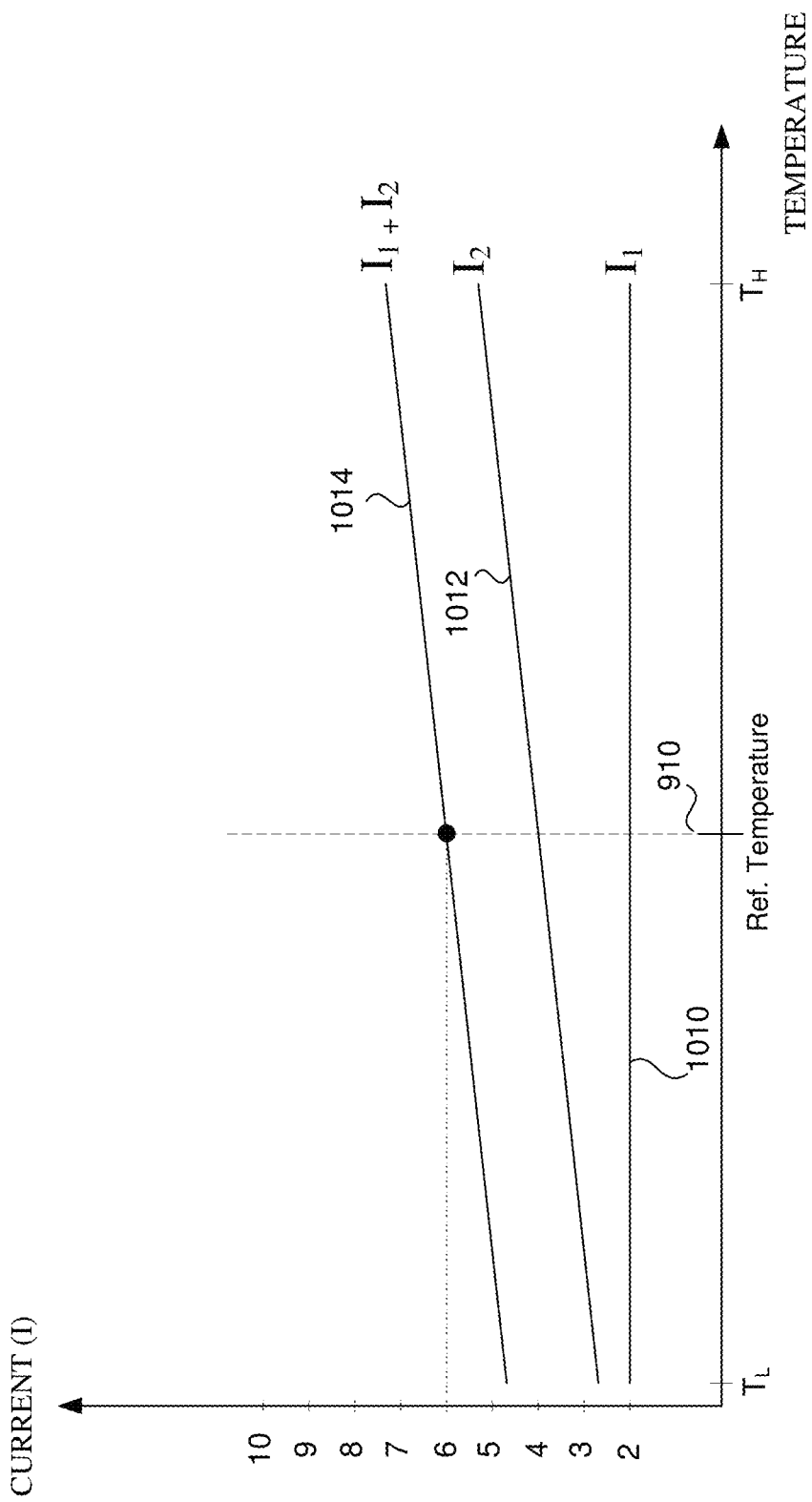
FIG. 10 is a plot of the current that flows through the current control circuit similar to FIG. 9, but having a different value for the n-bit digital control signal is applied.

FIG. 10 is a plot of the current that flows through the current control circuit 705 when a different value for the n-bit digital control signal is applied. In particular, in the case shown in FIG. 10, a value for the n-bit digital signal to the current control circuit 705 is provided that decreases the controllable resistance of the VRC 708 by 75% and increases the controllable resistance of the VRC 706 by 50%, thus keeping the total resistance of the current control circuit 705 constant at the reference temperature. This change results in the VRC 708 supplying two thirds of the current and the VRC 706 supplying one third of the current at the reference temperature. A line 1010 shows the current versus temperatures from a temperature $T_L$ to a temperature $T_H$ for the current $I_1$ that flows through the VRC 706. A second line 1012 shows the current versus temperature curve for the current $I_2$ that flows through the VRC 708. As can be seen, the VRC 708 supplies twice as much current as the VRC 706 at the reference temperature 910. Assuming, as shown, that the temperature coefficient of each VRC 706, 708 remains constant with changes in the controllable resistance, the current $I_2$ at the low temperature $T_L$ will be equal to 2.667 and the current $I_2$ at the high temperature will be equal to 5.333. The current $I_1$ has a temperature coefficient of zero, so will remain at 2. Therefore, the total current $I_{out}$ shown by line 1014 will be equal to 4.667 at the low temperature $T_L$ and 7.333 at the high temperature $T_H$. That results in a temperature coefficient of 7.333/4.667=1.57. Therefore, it can be seen from this example that by decreasing the controllable resistance of the VRC 708 by 75% and increasing the controllable resistance of the VRC 706 by 50%, the temperature coefficient will increase from 1.4 to 1.57. Stated another way, by decreasing the amount of current that flows through the VRC 706 and increasing the amount of current that flows through the VRC 708, the current $I_{out}$ output from the current control circuit 705 has a higher temperature coefficient.

Conversely, if the amount of current that flows through the VRC 706 is greater than the current that flows through the VRC 708, then the total current flowing through the FET 508 will have a lower temperature coefficient than is the case when the current through each VRC 706, 708 is equal. Accordingly, it can be seen that by changing the relative controllable resistance (i.e., the amount of current that flows through each of the two VRCs 706, 708,) the temperature coefficient for the total current $I_{out}$ through the FET 508 can be controlled.

Furthermore, by maintaining essentially a constant resistance between the drain of the FET 508 and ground for particular reference temperature, while varying the ratio of the two VRCs 706, 708, the plot of the current will pivot around the point defined by the reference temperature (a total current of 6 in the example shown in FIGS. 9 and 10). It should be further noted that the total current can be shifted up and down (i.e., the magnitude of the current can be changed while maintaining the same slope) by changing the total resistance through the parallel pair of VRCs 706, 708 while keeping the ratio of the resistance of the two VRC 706, 708 constant. Further adjustments to the magnitude of the current are possible by adjusting the IDAC scaling factor (i.e., the number of current mirrors in the IDAC 704 that are turned on).

In some embodiments, the controllable resistance of the two VRCs 706, 708 are controlled such that when a bias current having a higher temperature coefficient is desired, the resistance of the VRC 708 having a high negative temperature coefficient decreases while the resistance VRC 706 having the low (or zero) temperature coefficient increases. The result is that the relative contribution to the total current from VRC 706 goes down when a bias current having a higher negative temperature coefficient is desired. Accordingly, the contribution to the total current from the VRC 708 goes up when a bias current having a higher negative temperature coefficient is desired.

In some embodiments, a very high combined resistance can be set for the parallel paths through the two VRCs 706, 708 to generate a "trickle current" output from the VWT circuit 702. In some embodiments, the trickle current is output when it is desirable to turn the amplifier off. That is, the trickle current is defined as a current that is below standby current requirements. The trickle current provides a relatively small bias to the amplifier. In some embodiments, the trickle current is 100 nA. Providing a small bias to the amplifier makes it possible to rapidly turn the amplifier "on" again (i.e., when gain is desired from the amplifier). In some such embodiments, the VRC 708 or 706 is turned off (the path through the VRC 708 or 706 is opened) and only a relatively high resistance provided by VRC 706 or 708 is coupled between the reference circuit 703 and ground.

Figure 11A:
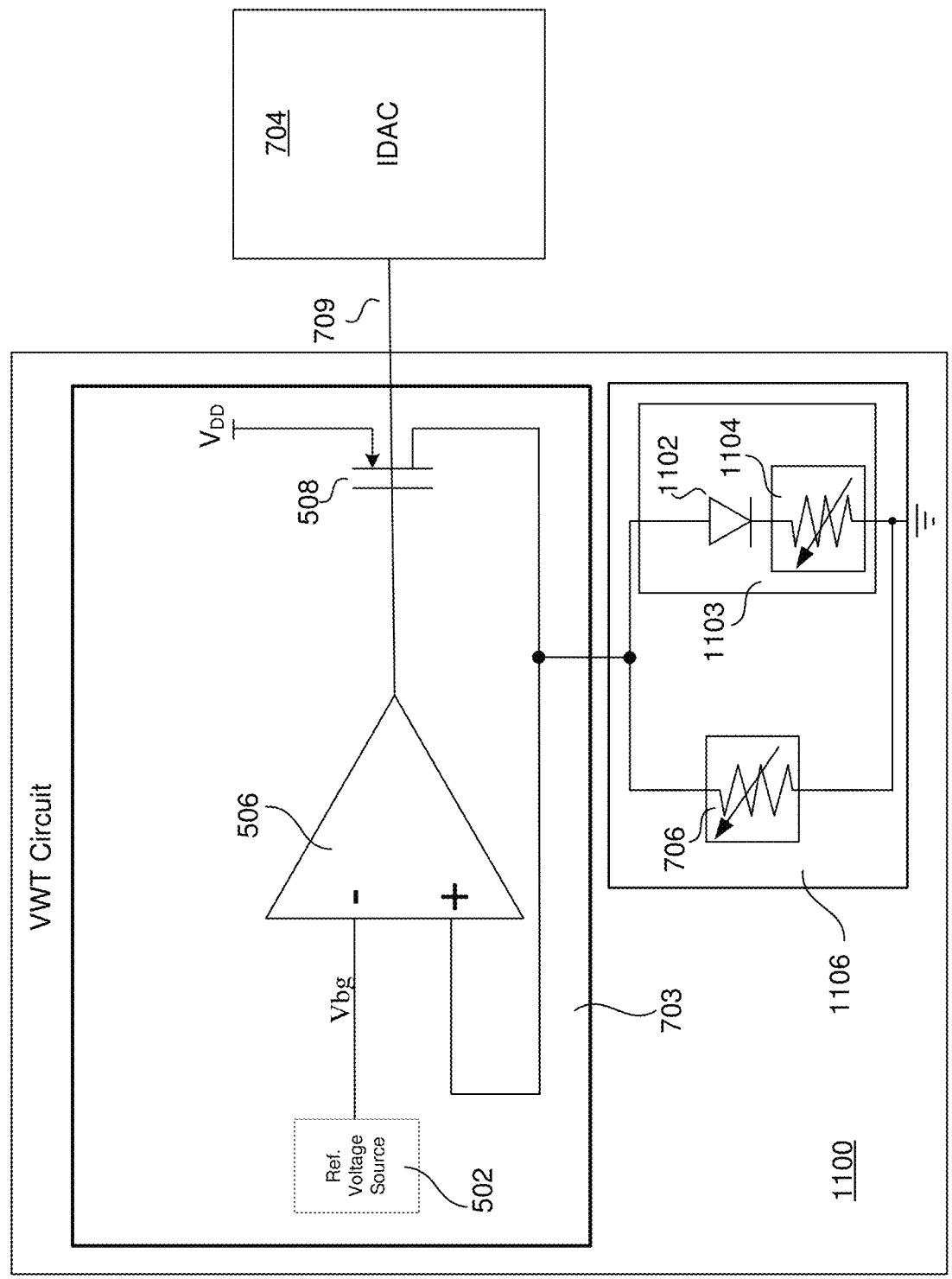
FIG. 11a is a simplified schematic of a VWT circuit in accordance with another embodiment of the disclosed method and apparatus.
Figure 11B:
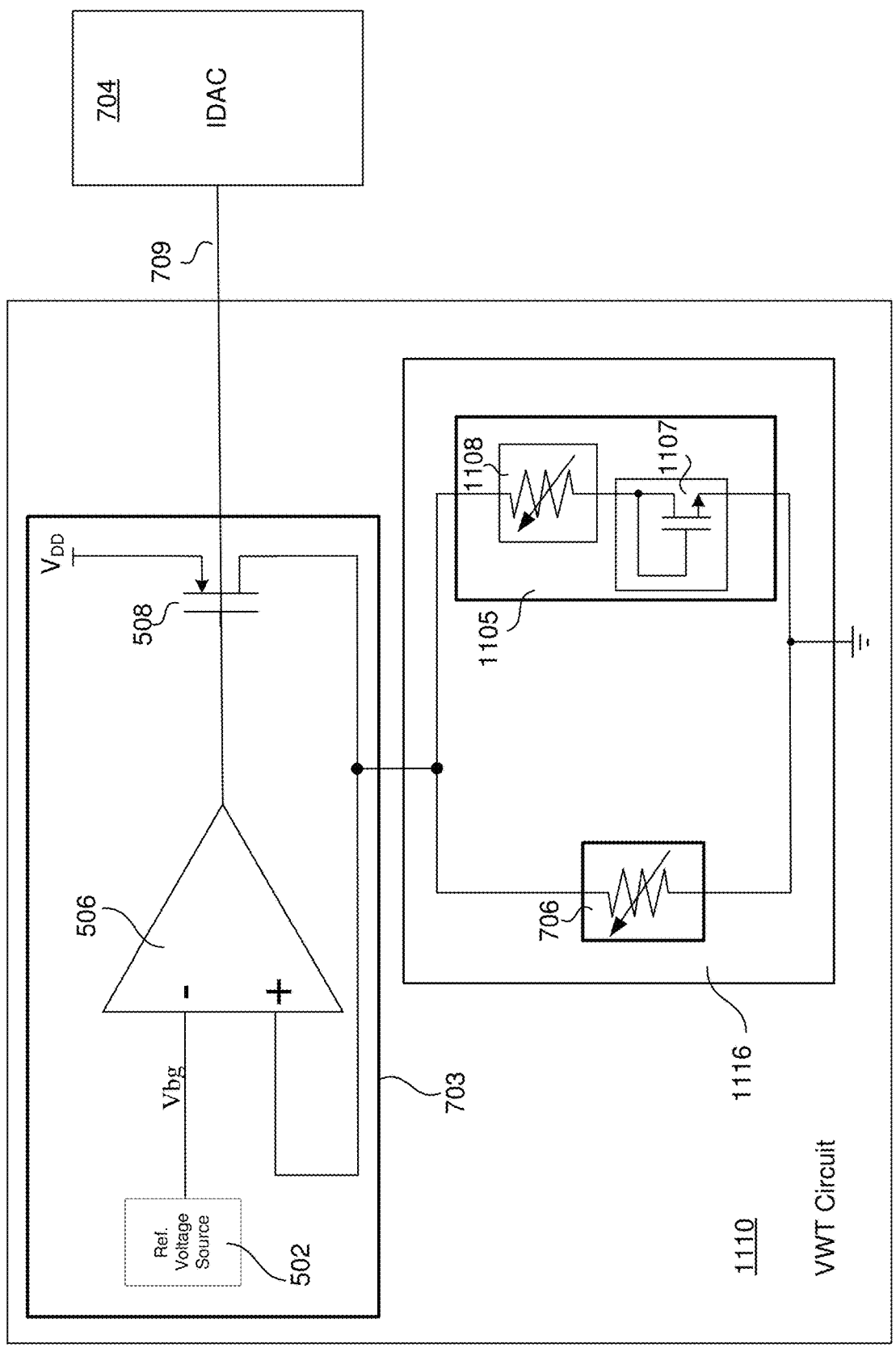
FIG. 11b shows the current control element implemented as "diode connected FET" in series with a VRC, with the source of an NMOS FET connected directly to GND.
Figure 11C:
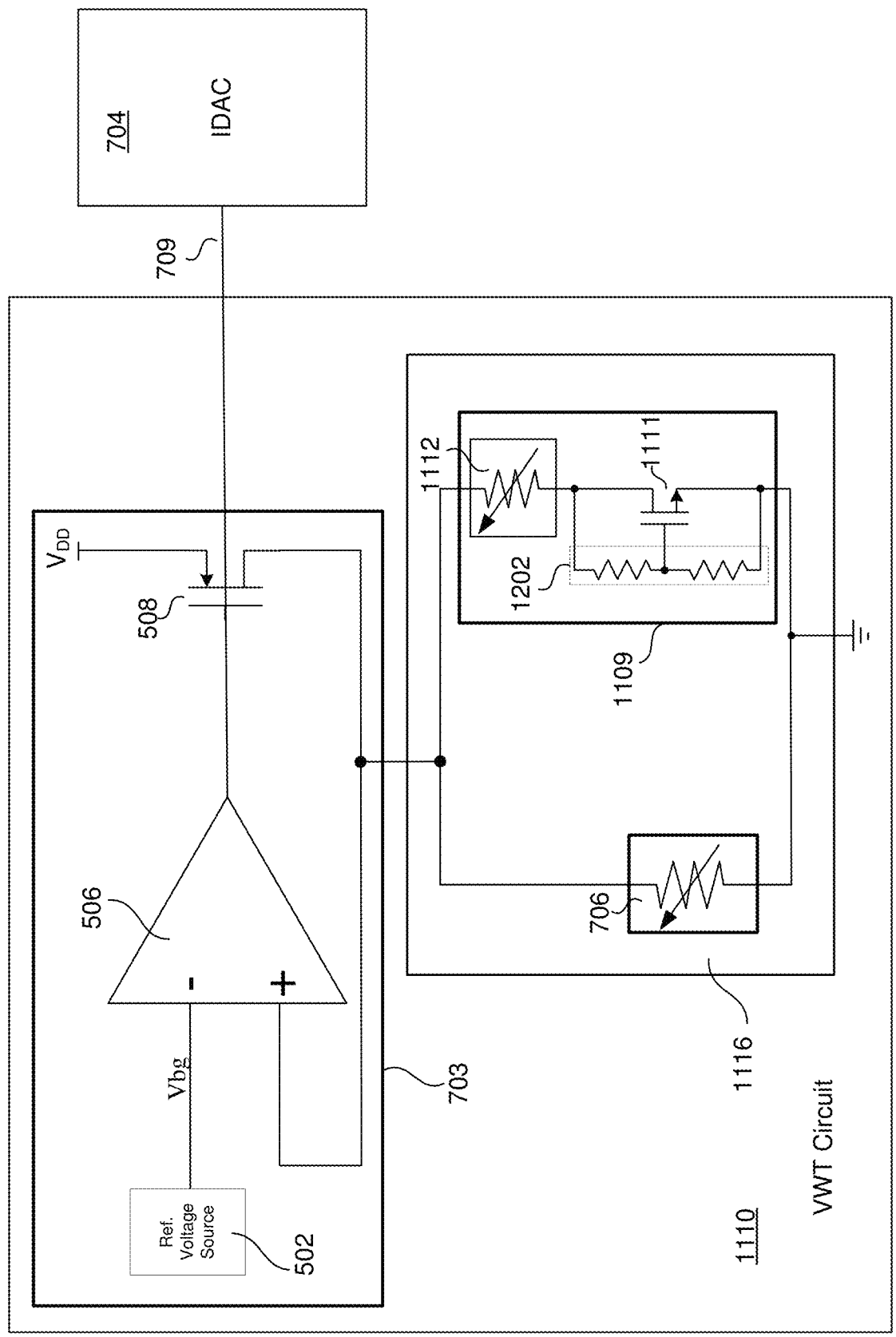
FIG. 11c illustrates an embodiment in which a resistive divider is used to generate a gate voltage that allows the $V_{ds}$ and $V_{gs}$ voltages of a FET to be better matched to the actual FETs used in the amplifier.

FIG. 11a is a simplified schematic of a VWT circuit 1100 in accordance with another embodiment of the disclosed method and apparatus. A current control element 1103 comprises a temperature coefficient device 1102 in series with a VRC 1104. The temperature coefficient device 1102 provides additional control over the temperature coefficient of a current control circuit 1106, making it possible to control the temperature coefficient of the current control circuit 1106 more accurately and/or provide a larger temperature coefficient for the current that flows through the VRC 1103. In some embodiments, the temperature coefficient device is a diode that is matched to an amplifier FET within an amplifier to which bias current is provided by the VWT circuit 1100. In other embodiments, other structures can be used to implement the current control element 1103, as will be understood by those skilled in the art. For example, FIG. 11b shows the current control element 1103 implemented as "diode connected FET" 1107 (i.e. gate-to-drain connected NMOS FET) in series with the VRC 1108, with the source of the NMOS FET is connected directly to GND. Such a diode connected FET 1107 can be the exact type of NMOS device being used in the amplifier. Thus, the temperature coefficient will track better than is otherwise possible when using a dedicated diode device (i.e. the gate-to-drain connected FET 1107 would be a "like-kind" device). In yet another alternative embodiment shown in FIG. 11c, a resistive divider 1202 is used to generate a gate voltage that allows the $V_{ds}$ and $V_{gs}$ voltages of a FET 1111 to be matched better to the actual FETs used in the amplifier.

Figure 11D:
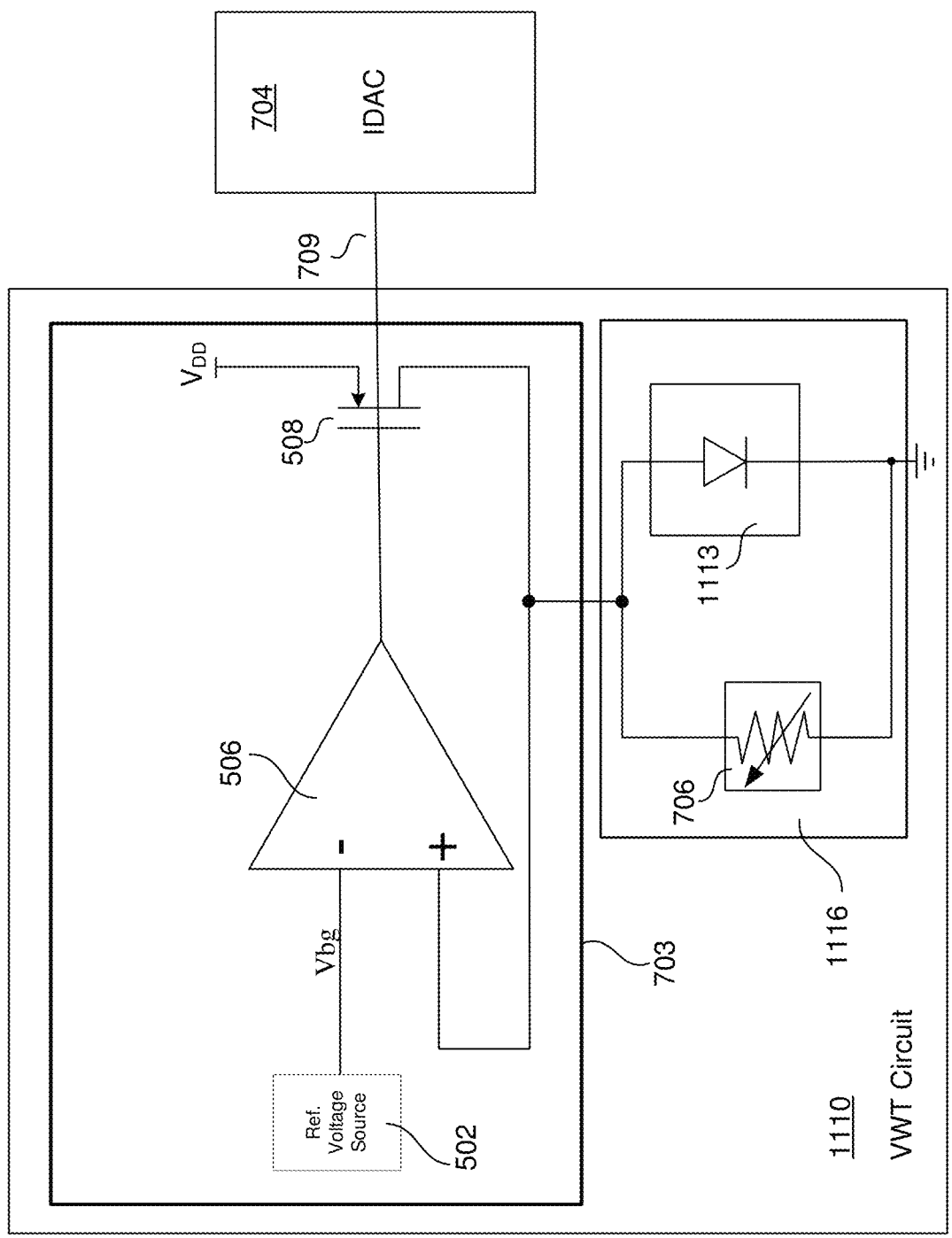
FIG. 11d is a simplified schematic of a VWT circuit in accordance with another embodiment of the disclosed method and apparatus in which a current control element is a temperature coefficient device, such as a diode standing alone.

FIG. 11d is a simplified schematic of a VWT circuit 1110 in accordance with another embodiment of the disclosed method and apparatus. A current control element 1113 is a temperature coefficient device, such as a diode standing alone. The current that flows in such a current control element 1113 will be a function of temperature.

In some embodiments, at least one of the temperature sensitive devices 1102, 1103, 1104, 1105, 1107, 1108, 1109, 1111, 1112, 1113 can be placed remotely from reference circuit 703. In other embodiments, several remote temperature sensitive devices can be placed in series or in parallel to provide temperature feedback to the reference circuit 703 from several remote locations. Similarly, one or more VRCs 708 of the VWT 702 can be placed remotely. Such VRCs can be placed in series or in parallel to provide a combined temperature feedback from several locations remote to the reference circuit and/or IDACs 704, 710.

Methods

Figure 12:
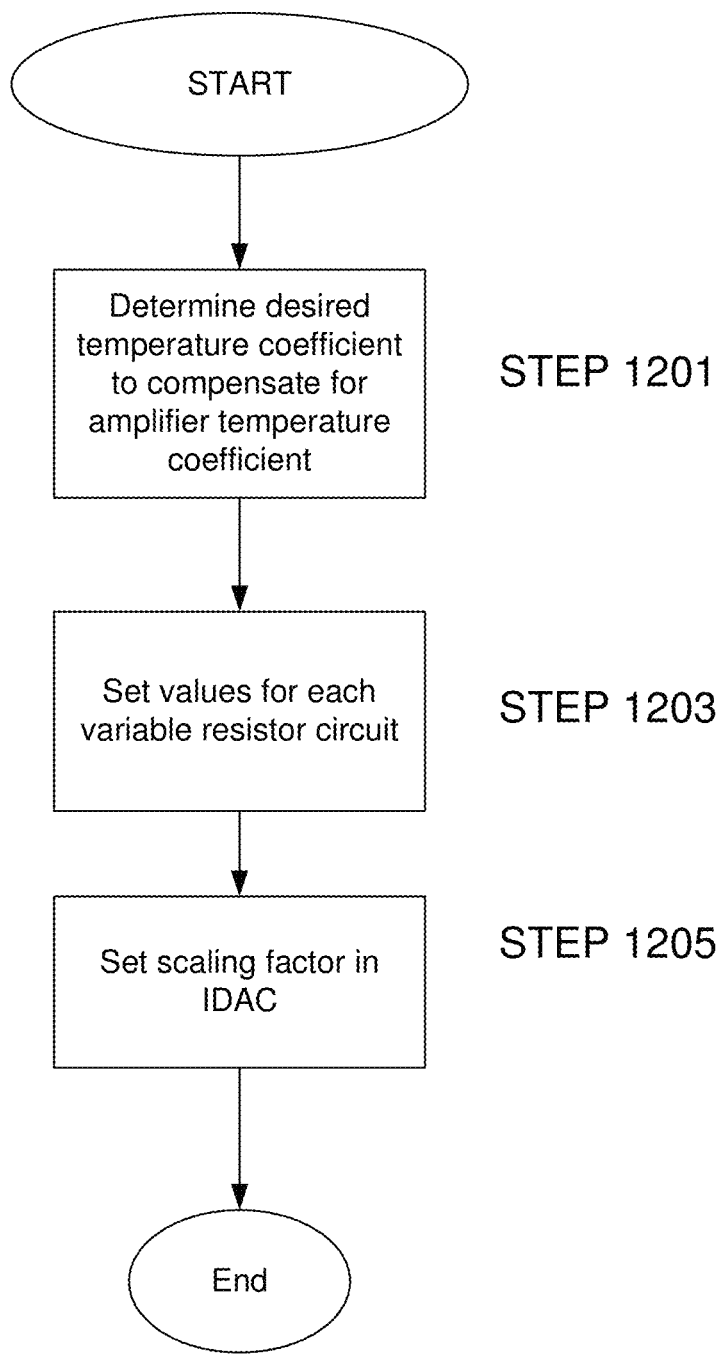
FIG. 12 illustrates one embodiment of a method for setting a bias current to an amplifier for which a relatively constant gain over temperature is desired.

FIG. 12 illustrates one embodiment of a method for setting a bias current to an amplifier for which a relatively constant gain over temperature is desired. The method includes determining a desired temperature coefficient for the bias current (STEP 1201). In one embodiment, the desired temperature coefficient is determined by plotting the gain versus temperature of the amplifier. Once the desired temperature coefficient is determined, at least two current control elements of a control circuit (such as the current control circuit 705) are provided. Contribution values of the two current control elements (such as VRCs 706, 708 (or 1103)) are set to provide a current that is the sum of the individual current through each of the VRCs 706, 708 (or 1103) of the control circuit 705. The current will have the desired temperature coefficient as a consequence of the relative contribution of each VRC 706, 708 (or 1103) to the total current through the control circuit 705. The VWT circuit 702 (or 1100) in turn provides an output having the desired temperature coefficient in response to the current through the control circuit 705 (STEP 1203). Each contribution value determines the relative contribution of the VRC 706, 708 (or 1103) to the total current output from the current control circuit. Next, the scaling factor of the IDAC 704 is set (STEP 1205). In some embodiments, the method further includes setting the contribution values to establish a trickle current through the current control circuit 705. Some embodiments of the method include coupling the output from the IDA to an amplifier and placing at least a portion of the current control elements 706, 708 (or 1103) at a location that is remote from the amplifier to which a temperature compensated bias is to be provided, as discussed above with regard to the current control circuit 705.

Figure 13:
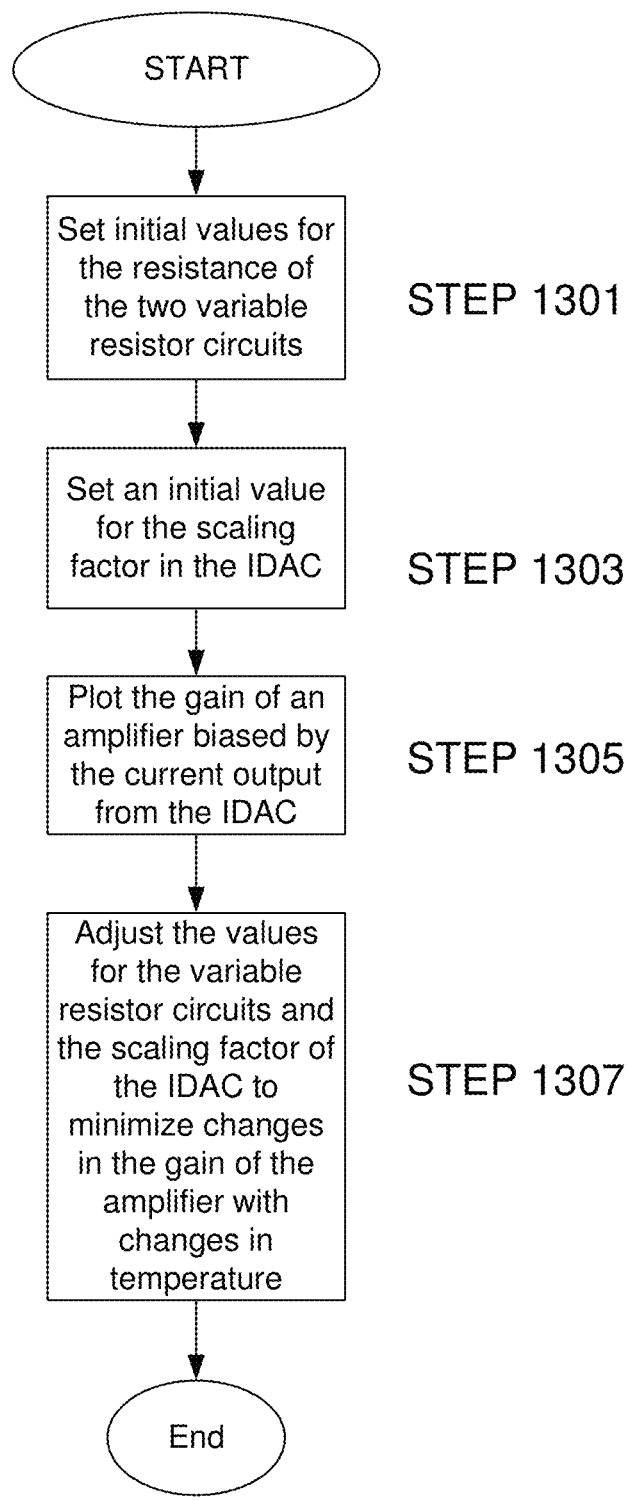
FIG. 13 is an alternative embodiment of a method for setting a bias current to maintain a relatively constant gain over temperature.

FIG. 13 is an alternative embodiment of a method for setting a bias current to maintain a relatively constant gain over temperature. Initially, initial contribution values are set for the amount of resistance to be applied by each of the two current control elements (such as VRCs 706, 708 (or 1103)) (STEP 1301). Next, an initial value is set for the scaling factor to be applied by the IDAC 704 (STEP 1303). Once initial values are set, a plot of the gain of the amplifier over a desired temperature range is taken (STEP 1305). The scaling factor applied by the IDAC 704 and the amount of resistance provided by each of the two VRCs 706, 708 (or 1103) is then adjusted to reduce the temperature coefficient of the amplifier (i.e., compensate for any rise/fall in gain as the temperature rises) (STEP 1307).

Fabrication Technologies and Options

The term "FET" means any transistor that has an insulated gate whose voltage determines the conductivity of the transistor. However, other types of transistors can be used to implement the disclosed method and apparatus. Furthermore, each FET disclosed may be implemented as a "stacked device" in which more than one FET is connected together to increase the effective voltage handling capability of the FET. In addition, switches disclosed above may be implemented using transistors, such as FETs.

Various embodiments can be implemented to meet a wide variety of specifications. Unless otherwise noted above, selection of suitable component values is a matter of design choice. Various embodiments of the disclosed method and apparatus may be implemented in any suitable IC technology (including but not limited to FET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS) bipolar, GaAs HBT, GaN HEMT, GaAs pHEMT, and MESFET technologies.

While a number of embodiments of the disclosed method and apparatus have been described, it is to be understood that various modifications may be made without departing from the spirit and scope of the claimed invention. For example, some of the steps described above may be order independent, and thus can be performed in an order different from that described. Further, some of the steps described above may be optional. Various activities described with respect to the methods identified above can be executed in repetitive, serial, or parallel fashion. Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

It is to be understood that the foregoing description is intended to illustrate and not to limit the scope of the claimed invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A controllable temperature coefficient bias circuit including:
    (a) a constant current with temperature (CWT) circuit having an output;
    (b) a first variable scaling circuit having a signal input coupled to the output of the CWT circuit and an output comprising a scaled version of the output of the CWT circuit;
    (c) a Proportional To Ambient Temperature (PTAT) circuit having an output; and
    (d) a second variable scaling circuit having a signal input coupled to the output of the PTAT circuit and an output comprising a scaled version of the output of the PTAT circuit and coupled to the output of the first variable scaling circuit.

2. The controllable temperature coefficient bias circuit of claim 1, further including a control processor having a first and second control output and wherein:
  (a) the first variable scaling circuit includes a control input coupled to the first control output of the control processor and is configured to output a current proportional to signals applied to the first variable scaling circuit signal input scaled in response to a first scaling factor received at the control input of the first variable scaling circuit; and
  (b) the second variable scaling circuit includes a control input coupled to the second control output of the control processor and is configured to output a current proportional to signals applied to the second variable scaling circuit signal input scaled in response to a second scaling factor received at the control input of the second variable scaling circuit.

3. The controllable temperature coefficient bias circuit of claim 2, wherein a temperature coefficient of the coupled outputs of the first variable scaling circuit and the second variable scaling circuit may be adjusted by adjusting the relative values of the first and second scaling factors.

4. The controllable temperature coefficient bias circuit of claim 2, wherein:
  (a) the first variable scaling circuit includes at least two selectively enabled current mirrors, the current in each enabled current mirror of the first variable scaling circuit being summed at the output of the first variable scaling circuit; and
  (b) the second variable scaling circuit includes at least two selectively enabled current mirrors, the current in each enabled current mirror of the second variable scaling circuit being summed at the output of the second variable scaling circuit.

5. The controllable temperature coefficient bias circuit of claim 4, wherein a temperature coefficient of the coupled output of the first variable scaling circuit and the second variable scaling circuit may be adjusted by adjusting the relative values of the first and second scaling factors.

6. The controllable temperature coefficient bias circuit of claim 1, wherein the CWT circuit includes:
  (a) a transistor having a gate, a drain coupled to a node, and a source, the source configured to be coupled to a voltage supply;
  (b) a resistor coupled between the node and configured to be coupled to ground;
  (c) a reference voltage source; and
  (d) an operational amplifier having a first input coupled to the reference voltage source, a second input coupled to the node, and an output coupled to the gate to the transistor.

7. The controllable temperature coefficient bias circuit of claim 1, further including a control processor having a first and second control output and wherein:
  (a) the first variable scaling circuit includes a control input coupled to the first control output of the control processor and is configured to provide an output proportional to a first scaling factor received at the control input of the first variable scaling circuit; and
  (b) the second variable scaling circuit includes a control input coupled to the second control output of the control processor and is configured to provide an output proportional to a second scaling factor received at the control input of the second variable scaling circuit.

8. The controllable temperature coefficient bias circuit of claim 7, wherein a temperature coefficient of the coupled outputs of the first variable scaling circuit and the second variable scaling circuit may be adjusted by adjusting the relative values of the first and second scaling factors.

9. The controllable temperature coefficient bias circuit of claim 7, wherein:
  (a) the first variable scaling circuit includes at least two selectively enabled current mirrors, the current in each enabled current mirror of the first variable scaling circuit being summed at the output of the first variable scaling circuit; and
  (b) the second variable scaling circuit includes at least two selectively enabled current mirrors, the current in each enabled current mirror of the second variable scaling circuit being summed at the output of the second variable scaling circuit.

10. The controllable temperature coefficient bias circuit of claim 9, wherein a temperature coefficient of the coupled output of the first variable scaling circuit and the second variable scaling circuit may be adjusted by adjusting the relative values of the first and second scaling factors.

11. An amplifier circuit including:
  (a) a constant current with temperature (CWT) circuit having an output;
  (b) a first variable scaling circuit having a signal input coupled to the output of the CWT circuit and an output comprising a scaled version of the output of the CWT circuit;
  (c) a Proportional To Ambient Temperature (PTAT) circuit having an output;
  (d) a second variable scaling circuit having a signal input coupled to the output of the PTAT circuit and an output comprising a scaled version of the output of the PTAT circuit; and
  (e) an amplifier including a bias input coupled to the output of the first variable scaling circuit and the second variable scaling circuit.

12. The amplifier circuit of claim 11, wherein the first variable scaling circuit and the second variable scaling circuit enable trimming of a bias current or voltage applied to the bias input of the amplifier to offset changes of a transconductance value $g_m$ of the amplifier due to temperature changes affecting the amplifier circuit.

13. The amplifier circuit of claim 11, further including a control processor having a first and second control output and wherein:
  (a) the first variable scaling circuit includes a control input coupled to the first control output of the control processor and is configured to output a current proportional to signals applied to the first variable scaling circuit signal input scaled in response to a first scaling factor received at the control input of the first variable scaling circuit; and
  (b) the second variable scaling circuit includes a control input coupled to the second control output of the control processor and is configured to output a current proportional to signals applied to the second variable scaling circuit signal input scaled in response to a second scaling factor received at the control input of the second variable scaling circuit.

14. The amplifier circuit of claim 13, wherein a temperature coefficient of the coupled outputs of the first variable scaling circuit and the second variable scaling circuit may be adjusted by adjusting the relative values of the first and second scaling factors.

15. The amplifier circuit of claim 13, wherein:
  (a) the first variable scaling circuit includes at least two selectively enabled current mirrors, the current in each enabled current mirror of the first variable scaling circuit being summed at the output of the first variable scaling circuit; and (b) the second variable scaling circuit includes at least two selectively enabled current mirrors, the current in each enabled current mirror of the second variable scaling circuit being summed at the output of the second variable scaling circuit.

16. The amplifier circuit of claim 15, wherein a temperature coefficient of the coupled output of the first variable scaling circuit and the second variable scaling circuit may be adjusted by adjusting the relative values of the first and second scaling factors.

17. The amplifier circuit of claim 11, wherein the CWT circuit includes:

(a) a transistor having a gate, a drain coupled to a node, and a source, the source configured to be coupled to a voltage supply;

(b) a resistor coupled between the node and configured to be coupled to ground;

(c) a reference voltage source; and (d) an operational amplifier having a first input coupled to the reference voltage source, a second input coupled to the node, and an output coupled to the gate to the transistor.

18. The amplifier circuit of claim 11, further including a control processor having a first and second control output and wherein:

(a) the first variable scaling circuit includes a control input coupled to the first control output of the control processor and is configured to provide an output proportional to a first scaling factor received at the control input of the first variable scaling circuit; and (b) the second variable scaling circuit includes a control input coupled to the second control output of the control processor and is configured to provide an output proportional to a second scaling factor received at the control input of the second variable scaling circuit.

19. The amplifier circuit of claim 18, wherein a temperature coefficient of the coupled outputs of the first variable scaling circuit and the second variable scaling circuit may be adjusted by adjusting the relative values of the first and second scaling factors.

20. The amplifier circuit of claim 18, wherein:

(a) the first variable scaling circuit includes at least two selectively enabled current mirrors, the current in each enabled current mirror of the first variable scaling circuit being summed at the output of the first variable scaling circuit; and (b) the second variable scaling circuit includes at least two selectively enabled current mirrors, the current in each enabled current mirror of the second variable scaling circuit being summed at the output of the second variable scaling circuit.

* * * * *